(12) United States Patent
Kurokawa et al.

(10) Patent No.: US 8,772,701 B2
(45) Date of Patent: Jul. 8, 2014

(54) PHOTODETECTOR AND DISPLAY DEVICE WITH LIGHT GUIDE CONFIGURED TO FACE PHOTODETECTOR CIRCUIT AND REFLECT LIGHT FROM A SOURCE

(75) Inventors: Yoshiyuki Kurokawa, Sagamihara (JP); Takayuki Ikeda, Atsugi (JP); Hikaru Tamura, Zama (JP); Munehiro Kozuma, Isehara (JP); Masataka Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 442 days.

(21) Appl. No.: 13/113,470

(22) Filed: May 23, 2011

(65) Prior Publication Data

US 2011/0291013 A1 Dec. 1, 2011

(30) Foreign Application Priority Data

May 28, 2010 (JP) ................................. 2010-122208

(51) Int. Cl.
*G01J 1/04* (2006.01)
*G01J 1/44* (2006.01)

(52) U.S. Cl.
USPC ................. 250/221; 250/227.14; 250/214 AL

(58) Field of Classification Search
USPC .................. 250/556, 227.14, 227.22, 227.24, 250/214 AL, 221, 216; 356/71; 385/8, 9, 13; 345/137, 175, 176, 178, 179
See application file for complete search history.

(56) References Cited

U.S. PATENT DOCUMENTS

| 5,303,322 | A | * | 4/1994 | Winston et al. ................ 385/146 |
| 5,731,856 | A | | 3/1998 | Kim et al. |
| 5,744,864 | A | | 4/1998 | Cillessen et al. |
| 5,905,583 | A | * | 5/1999 | Kawai et al. .................. 358/484 |
| 6,294,274 | B1 | | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Georgia Y Epps
*Assistant Examiner* — Carolynn A Moore
(74) *Attorney, Agent, or Firm* — Eric J. Robinson; Robinson Intellectual Property Law Office, P.C.

(57) ABSTRACT

Influence of external light is suppressed. With a photodetector including a photodetector circuit which generates a data signal in accordance with illuminance of incident light and a light unit which overlaps with the photodetector circuit, a first data signal is generated by the photodetector circuit when the light unit is in an ON state, a second data signal is formed by the photodetector circuit when the light unit is in an OFF state, and the first data signal and the second data signal are compared, so that a difference data signal that is data of a difference between the two compared data signals is generated.

17 Claims, 21 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,271,835 B2 | 9/2007 | Iizuka et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,351,949 B2 * | 4/2008 | Oon et al. | 250/221 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,523 B2 | 4/2009 | Yamazaki et al. | |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0233494 A1 * | 10/2005 | Hong | 438/57 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0157760 A1 | 7/2006 | Hayashi et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0227120 A1 * | 10/2006 | Eikman | 345/175 |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0018075 A1 | 1/2007 | Cazaux et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0054319 A1 | 3/2008 | Mouli | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0091554 A1 * | 4/2009 | Keam | 345/175 |
| 2009/0101948 A1 | 4/2009 | Park et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0295769 A1 | 12/2009 | Yamazaki et al. | |
| 2010/0065844 A1 * | 3/2010 | Tokunaga | 257/43 |
| 2010/0092820 A1 | 4/2010 | Itagaki et al. | |
| 2010/0109002 A1 | 5/2010 | Itagaki et al. | |
| 2010/0117991 A1 | 5/2010 | Koyama et al. | |
| 2010/0182282 A1 | 7/2010 | Kurokawa et al. | |
| 2010/0289755 A1 * | 11/2010 | Zhu et al. | 345/173 |
| 2010/0308737 A1 * | 12/2010 | Hilgers | 315/152 |
| 2011/0122111 A1 * | 5/2011 | Brown et al. | 345/207 |

FOREIGN PATENT DOCUMENTS

| | | |
|---|---|---|
| JP | 60-198861 A | 10/1985 |
| JP | 62-210023 A | 8/1988 |
| JP | 63-210022 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-065239 A | 3/2007 |
| JP | 2009-187342 | 8/2009 |
| JP | 2009-187342 A | 8/2009 |
| WO | WO-2004/114391 | 12/2004 |
| WO | WO 2009148084 A1 * | 12/2009 ............ G06F 3/041 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15TH International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv.Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide, ", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors For Amoled Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In-Ga-Zn-Oxide TFTS,", IDW '09 : Proceedings of The 16th International Display Workshops, 2009, pp. 689-692.

Park.J et al., "Amorphous Indium-Gallium-Zinc Oxide TFTS and Their Application for Large Size Amoled,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD'09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 20070, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTS with a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13TH International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,$YBFE_2O_4$, and $YB_2FE_3O_7$ Types of Structures for Compounds in the $In_2O_3$ and $SC_2O_3$-$A_2O_3$-BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO_4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B) Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3(ZnO)_m$ (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett. (Applied Physics Letters) , Sep. 1, 2003, vol. 83, No. 9, pp. 1755-1757.

Tanaka et al., "45.5: A System LCD with Optical Input Function using Infra-Red Backlight Subtraction Scheme," SID Digest '10: SID International Symposium Digest of Technical Papers, 2010, pp. 680-683.

Jeon et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

\* cited by examiner

PHOTODETECTOR AND DISPLAY DEVICE WITH LIGHT GUIDE CONFIGURED TO FACE PHOTODETECTOR CIRCUIT AND REFLECT LIGHT FROM A SOURCE

BACKGROUND OF THE INVENTION

1. Field of the Invention

An embodiment of the present invention relates to a photodetector.

2. Description of the Related Art

In recent years, development of a technique of a device to which data is inputted by incidence of light (the device also referred to as a photodetector) has been promoted.

As an example of a photodetector, a photodetector provided with a photodetector circuit (also referred to as a photosensor) can be given (e.g., Patent Document 1). The above photodetector detects illuminance of light incident on the photodetector circuit and generates a data signal in accordance with the illuminance of light. When the photodetector is provided with a photodetector circuit and a display circuit, a display state of the display circuit can be controlled by using a data signal generated by the photodetector circuit, and thus the photodetector can function as a touch panel, for example.

REFERENCE

[Patent Document 1] Japanese Published Patent Application No. 2007-065239

SUMMARY OF THE INVENTION

In the conventional photodetector, external light (including light in an environment where a photodetector circuit is used) enters a photodetector circuit. Thus, illuminance by external light becomes noise in the data signal to be generated, and detection accuracy of reflection light from an object to be read is accordingly low. For example, in the case where data is inputted to the photodetector by entrance of reflection light from a finger, external light may cause that reflection light from a hand portion other than the finger is recognized as data equivalent to data brought by reflection light from the finger, in some cases.

An object of an embodiment of the present invention is to reduce influence of external light.

An embodiment of the present invention is to reduce influence of external light as follows: the state of a light unit provided in a photodetector is switched between a lighting state (hereinafter, referred to as an ON state) and a non-lighting state (hereinafter, referred to as an OFF state); a data signal in accordance with illuminance of incident light is generated by a photodetector circuit in each of the ON state and the OFF state; the two generated data signals are compared, whereby a difference data signal that is data of a difference between the compared data signals is generated; and data on external light is removed from the data signal.

An embodiment of the present invention is a method for driving a photodetector which includes a photodetector circuit generating a data signal in accordance with illuminance of incident light and a light unit including a light source and emitting light to the photodetector circuit, which includes steps of: generating a first data signal by the photodetector circuit when the light unit is set to be in an ON state; generating a second data signal by the photodetector circuit when the light unit is set to be in an OFF state; and comparing the first data signal and the second data signal, so that a difference data signal that is data of a difference between the two compared data signals is generated.

Another embodiment of the present invention is a method for driving a photodetector which includes a photodetector circuit generating a data signal in accordance with illuminance of incident light and a light unit including a light source and overlapping with the photodetector circuit, which includes steps of: generating a first data signal by the photodetector circuit when the light unit is set to be in one of a first ON state and a first OFF state; generating a second data signal by the photodetector circuit when the light unit is set to be in the other of the first ON state and the first OFF state; generating a third data signal by the photodetector circuit when the light unit is set to be in one of a second ON state and a second OFF state; generating a fourth data signal by the photodetector circuit when the light unit is set to be in the other of the second ON state and the second OFF state; generating a fifth data signal by the photodetector circuit when the light unit is set to be in one of a third ON state and a third OFF state; generating a sixth data signal by the photodetector circuit when the light unit is set to be in the other of the third ON state and the third OFF state; comparing the first data signal and the second data signal, so that a first difference data signal that is data of a difference between the compared first and second data signals is generated; comparing the third data signal and the fourth data signal, so that a second difference data signal that is data of a difference between the compared third and fourth data signals is generated; and comparing the fifth data signal and the sixth data signal, so that a third difference data signal that is data of a difference between the compared fifth and sixth data signals is generated.

Another embodiment of the present invention is a method for driving a photodetector which includes a photodetector circuit generating a data signal in accordance with illuminance of incident light and a light unit including a light source and overlapping with the photodetector circuit, which includes steps of: generating a first data signal by the photodetector circuit when the light unit is set to be a first ON state; generating a second data signal by the photodetector circuit when the light unit is set to be a second ON state; generating a third data signal by the photodetector circuit when the light unit is set to be a third ON state; generating a fourth data signal by the photodetector circuit when the light unit is set to be an OFF state; comparing the first data signal and the fourth data signal, so that a first difference data signal that is data of a difference between the compared first and fourth data signals is generated; comparing the second data signal and the fourth data signal, so that a second difference data signal that is data of a difference between the compared second and fourth data signals is generated; and comparing the third data signal and the fourth data signal, so that a third difference data signal that is data of a difference between the compared third and fourth data signals is generated.

Another embodiment of the present invention is a photodetector which includes: a reset signal output circuit outputting a reset signal; a reading selection signal output circuit outputting a reading selection signal; a photodetector circuit that receives the reset signal and the reading selection signal, is set to be a reset state in accordance with the reset signal, generates a data signal in accordance with illuminance of incident light, and outputs the data signal in accordance with the reading selection signal; a light unit that overlaps with the photodetector circuit and includes a light source and a control circuit controlling emission from the light source; a reading circuit reading out the data signal from the photodetector circuit; and a data processing circuit that compares two read-out data signals by the reading circuit and generates a difference data signal that is data of a difference between the compared data signals.

Another embodiment of the present invention is a photodetector which includes: a display selection signal output circuit outputting a display selection signal; a display data signal output circuit outputting a display data signal; a display circuit that receives the display selection signal and the display data signal in accordance with the display selection signal, and is set to be a display state in accordance with the display data signal; a reset signal output circuit outputting a reset signal; a reading selection signal output circuit outputting a reading selection signal; a photodetector circuit that receives the reset signal and the reading selection signal, is set to be a reset state in accordance with the reset signal, generates a data signal in accordance with illuminance of incident light, and outputs the data signal in accordance with the reading selection signal; a light unit that overlaps with the display circuit and the photodetector circuit and includes a light source and a control circuit controlling emission from the light source; a reading circuit reading out the data signal from the photodetector circuit; and a data processing circuit that compares two read-out data signals by the reading circuit and generates a difference data signal that is data of a difference between the compared data signals.

According to an embodiment of the present invention, influence of external light can be reduced and reading accuracy of an object to be read by a photodetector circuit can be improved.

DETAILED DESCRIPTION OF THE INVENTION

Examples of embodiments of the present invention will be described with reference to the drawings below. Note that the present invention is not limited to the following description because it will be easily understood by those skilled in the art that various changes and modifications can be made without departing from the spirit and scope of the present invention. Therefore, the present invention should not be interpreted as being limited to the description of the embodiments.

Note that contents of the embodiments can be appropriately combined with each other or replaced with each other.

Further, in this specification, the term "z (z is a natural number)" is used in order to avoid confusion among components, and the terms do not limit the components numerically.

(Embodiment 1)

In this embodiment, a photodetector which can detect illuminance of incident light will be described.

Figure 1A:
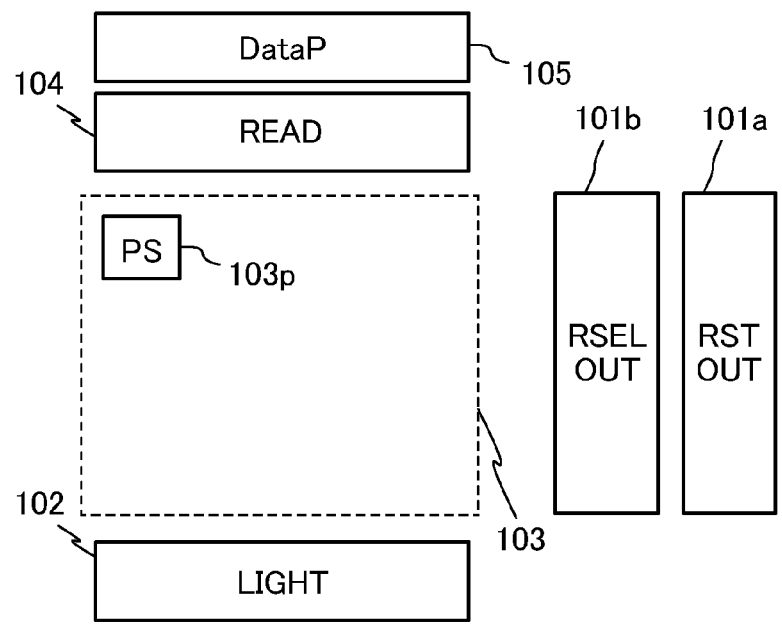
FIGS. 1A to 1C are diagrams showing an example of a photodetector in Embodiment 1.
Figure 1B:
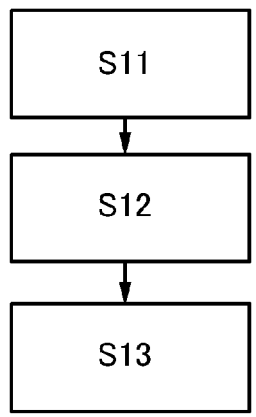
Figure 1C:
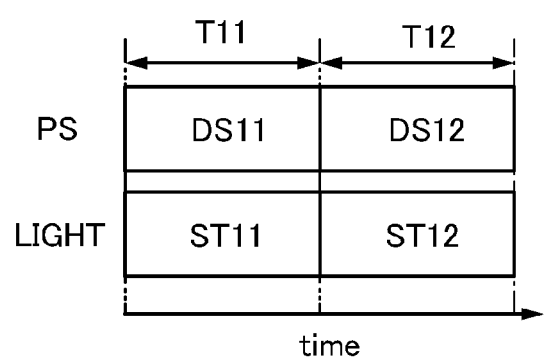

An example of a photodetector of this embodiment is described with reference to FIGS. 1A to 1C. FIGS. 1A to 1C are diagrams for describing the example of the photodetector of this embodiment.

First, a structural example of the photodetector of this embodiment is described with reference to FIG. 1A. FIG. 1A is a block diagram illustrating a structural example of the photodetector of this embodiment.

The photodetector illustrated in FIG. 1A includes a reset signal output circuit (also referred to as RSTOUT) 101*a*, a reading selection signal output circuit (also referred to as RSELOUT) 101*b*, a light unit (also referred to as LIGHT) 102, a photodetector circuit (also referred to as PS) 103*p*, and a reading circuit (also referred to as READ) 104.

The reset signal output circuit 101*a* has a function of outputting a reset signal (also referred to as a signal RST).

The reset signal output circuit 101*a* includes a shift register, for example. The shift register outputs a pulse signal, whereby the reset signal output circuit 101*a* can output a reset signal.

The reading selection signal output circuit 101*b* has a function of outputting a reading selection signal (also referred to as a signal RSEL).

The reading selection signal output circuit 101*b* includes a shift register, for example. The shift register outputs a pulse signal, whereby the reading selection signal output circuit 101*b* can output a reading selection signal.

The light unit 102 is a light emission unit provided with a light source and having a function of lighting when the light source emits light. No that the light unit 102 may be provided with a light control circuit so that luminance of light from the light unit 102 or the timing of lighting of the light unit 102 can be controlled with the light control circuit.

The light source can be constituted by a light-emitting diode (also referred to as an LED), for example. As a light-emitting diode, a light-emitting diode emitting light whose wavelength is in the infrared region (e.g., light whose wavelength is in a range greater than or equal to the visible light region and less than or equal to 1000 nm) (the diode also referred to as an infrared emission diode) or a light-emitting diode emitting light whose wavelength is in the visible light region (e.g., light whose wavelength is greater than or equal to 360 nm and less than or equal to 830 nm) (the diode also referred to as a visible light emission diode) can be used. As the visible light emission diode, for example, one or more of a white light-emitting diode, a red light-emitting diode, a green light-emitting diode, and a blue light-emitting diode can be used. Further, the light source can be constituted by a plurality of light-emitting diodes which emit light of different colors from each other (plural-color-light-emitting diodes). When the infrared emission diode is used, light can be detected even in a wavelength region where intensity of external light is low (e.g., a wavelength region in the vicinity of 900 nm).

The photodetector circuit 103p is provided in a photodetector portion 103. The photodetector portion 103 is a region where light is detected. Note that in the photodetector of this embodiment, the photodetector portion 103 may include a plurality of photodetector circuits 103p.

The photodetector circuit 103p has a function of generating a data signal that is a voltage corresponding to illuminance of incident light.

Note that the term "voltage" generally means a difference between potentials at two points (also referred to as a potential difference). However, both the level of voltage and the value of a potential are represented by volts (V) in a circuit diagram or the like in some cases; therefore, it is difficult to distinguish them. This is why in this specification, a potential difference between a potential at one point and a potential to be the reference (also referred to as the reference potential) is used as a voltage at the point in some cases.

A reset signal and a reading selection signal are inputted to the photodetector circuit 103p.

The photodetector circuit 103p is set to be in a reset state in accordance with the inputted reset signal. Note that when the photodetector circuit 103p is in a reset state, a data signal is a reference value.

Further, the photodetector circuit 103p has a function of outputting a data signal which is generated in accordance with the inputted reading selection signal.

The photodetector circuit 103p is formed with a photoelectric conversion element (also referred to as a PCE) and an amplifying transistor, for example.

The photoelectric conversion element is fed with a current (also referred to as a photocurrent) corresponding to the illuminance of incident light when light enters the photoelectric conversion element.

The amplifying transistor has two terminals and a control terminal for controlling a conduction state between the two terminals. The voltage of the control terminal changes in accordance with a photocurrent corresponding to the illuminance of incident light, whereby the amplifying transistor sets a value of a data signal of the photodetector circuit 103p. Thus, a value of the data signal outputted from the photodetector circuit 103p depends on the illuminance of light incident on the photodetector circuit 103p.

The photodetector circuit 103p may be further provided with a reading selection transistor so that the data signal can be outputted from the photodetector circuit 103p when the reading selection transistor is turned on in accordance with the reading selection signal.

The reading circuit 104 has a function of selecting the photodetector circuit 103p and reading out the data signal from the selected photodetector circuit 103p. Note that in the case of a plurality of photodetector circuits 103p, some of the plural photodetector circuits 103p may be selected at one time and the data signals can be read out therefrom.

For example, a selection circuit (e.g., a selector) may be used for the reading circuit 104.

The data signal read by the reading circuit 104 is processed by a data processing circuit (also referred to as DataP) 105 illustrated in FIG. 1A, for example.

The data processing circuit 105 is a circuit which performs arithmetic processing of the inputted data signal. The data processing circuit 105 is provided with a memory circuit (such as a frame memory) and an arithmetic circuit. The memory circuit has a function of storing data of the data signal, and the arithmetic circuit has a function of comparing the plurality of data signals.

Note that the data processing circuit 105 may be included in the photodetector. Alternatively, a data processing device (such as a personal computer) having a function equivalent to that of the data processing circuit may be provided separately and electrically connected to the photodetector. When the data processing circuit 105 is provided in the photodetector, the number of wirings in a portion for connecting the data processing circuit 105 and the reading circuit 104, and the like can be reduced.

Next, as an example of a method for driving the photodetector of this embodiment, an example of a method for driving the photodetector illustrated in FIG. 1A will be described with reference to FIGS. 1B and 1C. FIG. 1B is a flow chart for describing the example of a driving method of the photodetector illustrated in FIG. 1A, and FIG. 1C is a timing chart for describing the example of a driving method of the photodetector illustrated in FIG. 1A. Note that a case where a light source of the light unit 102 is a white emission diode is described here.

In the example of the driving method of the photodetector illustrated in FIG. 1A, operation of generating a data signal DS11 (also referred to as generation of the data signal DS11) is performed as a step S11, as shown in FIG. 1B.

At this time, as in a period T11 shown in FIG. 1C, the light unit 102 is set to be in an ON state or an OFF state (the state also referred to as a state ST11).

The photodetector circuit 103p is set to be in a reset state in accordance with a reset signal. Then, the photodetector circuit 103p generates the data signal DS11 and outputs the data signal DS11 in accordance with a reading selection signal.

Then, the reading circuit 104 reads the data signal DS11. Data of the read data signal DS11 is stored in the memory circuit in the data processing circuit 105.

Next, as shown in FIG. 1B, operation of generating a data signal DS12 (also referred to as generation of the data signal DS12) is performed as a step S12.

At this time, as in a period T12 shown in FIG. 1C, the light unit 102 is set to be in a state (also referred to as a state ST12) of an ON state or an OFF state, which is different from the state ST11.

The photodetector circuit 103p generates and outputs the data signal DS12 as the case of generation of the data signal DS11.

Then, the reading circuit 104 reads the data signal DS12. Data of the read data signals DS12 is stored in the memory circuit in the data processing circuit 105.

Next, as shown in FIG. 1B, operation of comparing a plurality of data signals (also referred to as data signal comparison) is performed as a step S13.

At this time, in the data processing circuit 105, the data of the data signal DS11 and the data of the data signal DS12 stored in the memory circuit are compared by the arithmetic circuit, and a difference data signal DDS11 that is data of a difference between the data signal DS11 and the data signal DS12 is generated. The difference data signal DDS11 is used as a data signal for executing the predetermined process.

Figure 2A:
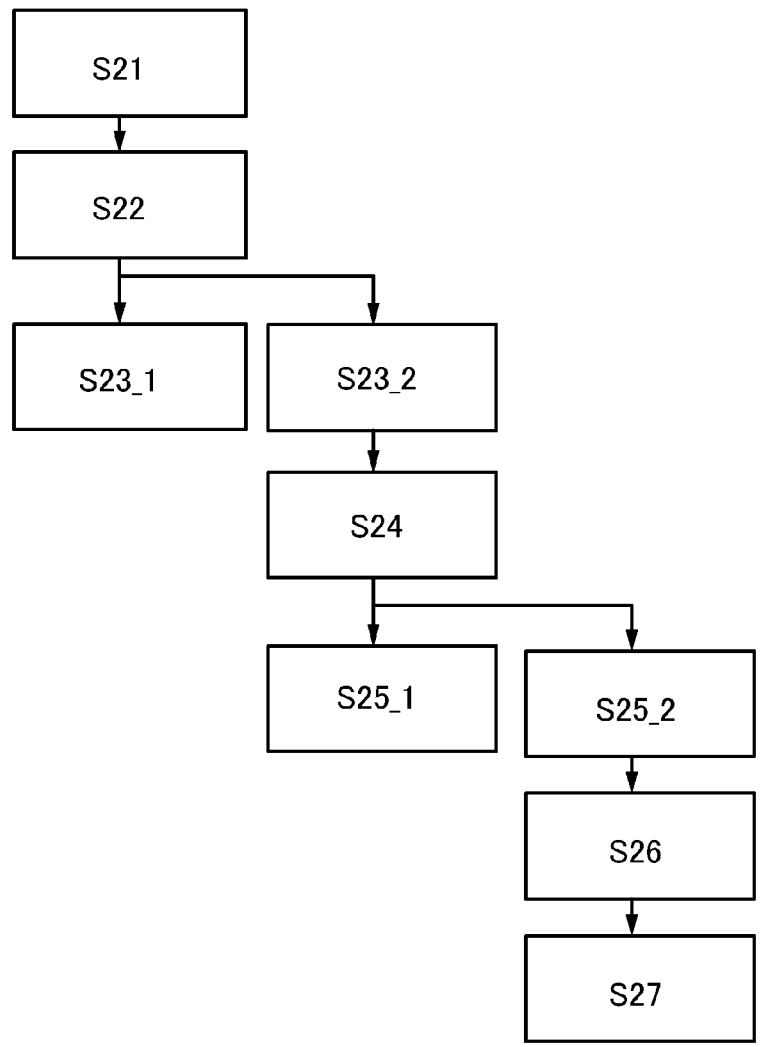
FIGS. 2A and 2B are diagram showing an example of a driving method of the photodetector in FIG. 1A.
Figure 2B:
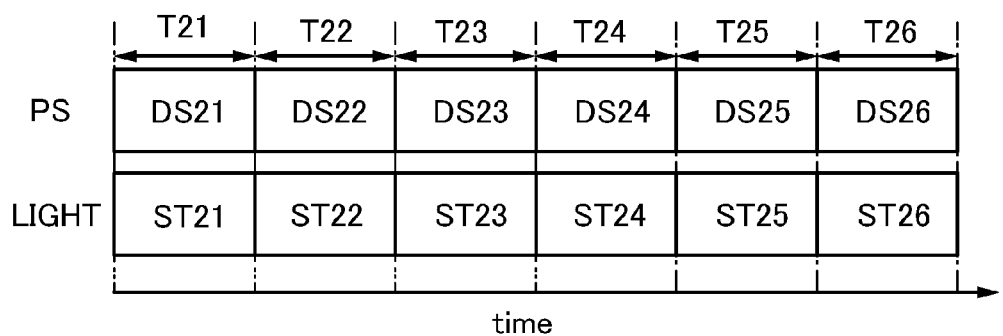

An example of a driving method of a photodetector in the case where the light source of the light unit 102 includes plural-color-light-emitting diodes is described with reference to FIGS. 2A and 2B. FIGS. 2A and 2B are diagrams for describing the driving method of the photodetector illustrated in FIG. 1A. FIG. 2A is a flow chart, and FIG. 2B is a timing chart. Note that the case where a light source includes light-emitting diodes of three colors is described as an example.

In the driving method of the photodetector in the case where the light source of the light unit 102 includes plural-color-light-emitting diodes, as shown in FIG. 2A, operation of generating a data signal DS21 (also referred to as generation of the data signal DS21) is performed as a step S21.

At this time, as in a period T21 shown in FIG. 2B, the light unit 102 is set to be in one of a first ON state and a first OFF state (the state also referred to as a state ST21). Note that in the first ON state, a first-color-light-emitting diode emits light.

The photodetector circuit 103p is set to be in a reset state in accordance with a reset signal. Then, the photodetector circuit 103p generates the data signal DS21 and outputs the data signal DS21 in accordance with a reading selection signal.

Further, the reading circuit 104 reads the data signal DS21. Data of the read data signal DS21 is stored in the memory circuit in the data processing circuit 105.

Next, as shown in FIG. 2A, operation of generating a data signal DS22 (also referred to as generation of the data signal DS22) is performed as a step S22.

At this time, as in a period T22 shown in FIG. 2B, the light unit 102 is set to be in the other of the first ON state and the first OFF state (the state also referred to as a state ST22).

The photodetector circuit 103p generates and outputs the data signal DS22 as in the case of generation of the data signal DS21.

The reading circuit 104 reads the data signal DS22. Data of the read data signal DS22 is stored in the memory circuit in the data processing circuit 105.

Next, as shown in FIG. 2A, operation of comparing a plurality of data signals is performed as a step S23_1.

At this time, in the data processing circuit 105, the data of the data signal DS21 and the data of the data signals DS22 stored in the memory circuit are compared by the arithmetic circuit, and a difference data signal DDS21 which is data of a difference between the data signal DS21 and the data signal DS22 is generated.

Further, as shown in FIG. 2A, operation of generating a data signal DS23 (also referred to as a data signal DS23) is performed as a step S23_2.

At this time, as in a period T23 shown in FIG. 2B, the light unit 102 is set to be in one of a second ON state and a second OFF state (also referred to as a state ST23). Note that in the second ON state, a second-color-light-emitting diode emits light.

Further, the photodetector circuit 103p generates and outputs the data signal DS23 as in the case of generation of the data signal DS21.

The reading circuit 104 reads the data signal DS23. Data of the read data signal DS23 is stored in the memory circuit in the data processing circuit 105.

Next, as shown in FIG. 2A, operation of generating a data signal DS24 (also referred to as generation of the data signal DS24) is performed as a step S24.

At this time, as in a period T24 shown in FIG. 2B, the light unit 102 is set to be in the other of the second ON state and the second OFF state (also referred to as a state ST24).

The photodetector circuit 103p generates and outputs the data signal DS24 as in the case of generation of the data signal DS21.

Further, the reading circuit 104 reads the data signal DS24. Data of the read data signal DS24 is stored in the memory circuit in the data processing circuit 105.

Next, as shown in FIG. 2A, operation of comparing a plurality of data signals is performed as a step S25_1.

At this time, in the data processing circuit 105, the data of the data signal DS23 and the data of the data signal DS24 stored in the memory circuit are compared by the arithmetic circuit, and a difference data signal DDS22 which is data of a difference between the data signal DS23 and the data signal DS24 is generated.

In addition, as shown in FIG. 2A, operation of generating a data signal DS25 (also referred to as generation of the data signal DS25) is performed as a step S25_2.

At this time, as in a period T25 shown in FIG. 2B, the light unit 102 is set to be in one of a third ON state and a third OFF state (also referred to as a state ST 25). Note that in the third ON state, a third-color-light-emitting diode emits light.

Further, the photodetector circuit 103p generates and outputs the data signal DS25 as in the case of generation of the data signal DS21.

The reading circuit 104 reads the data signal DS25. Data of the read data signal DS25 is stored in the memory circuit in the data processing circuit 105.

Next, as shown in FIG. 2A, operation of generating a data signal DS26 (also referred to as generation of the data signal DS26) is performed as a step S26.

At this time, as in a period T26 shown in FIG. 2B, the light unit 102 is set to be in the other of the third ON state and the third OFF state (also referred to as a state ST26).

The photodetector circuit 103p generates and outputs the data signal DS26 as in the case of generation of the signal DS21.

The reading circuit 104 reads the data signal DS26. Data of the read data signal DS26 is stored in the memory circuit in the data processing circuit 105.

Next, as shown in FIG. 2A, operation of comparing a plurality of data signals is performed as a step S27.

At this time, in the data processing circuit 105, the data of the data signal DS25 and the data of the data signal DS26 stored in the memory circuit are compared by the arithmetic circuit, and a difference data signal DDS23 which is data of a difference between the data signal DS25 and the data signal DS26 is generated.

Note that the difference data signals DDS21 to DDS23 are used as data signals for executing the predetermined processing.

Note that the periods T21 to T26 are not necessarily provided in succession. A period during which the light unit 102 is in an OFF state may be provided between the periods adjacent to each other. The number of colors is not limited to three as long as a plurality of colors is provided.

Figure 3A:
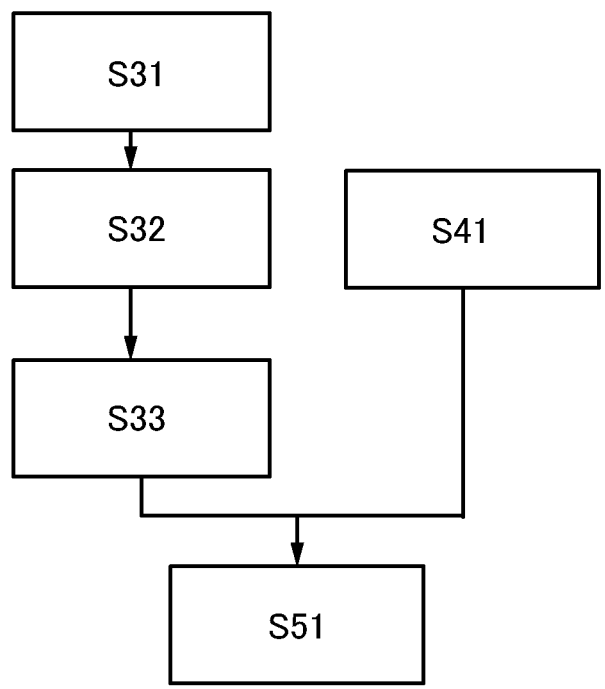
FIGS. 3A and 3B are diagram showing an example of a driving method of the photodetector in FIG. 1A.
Figure 3B:
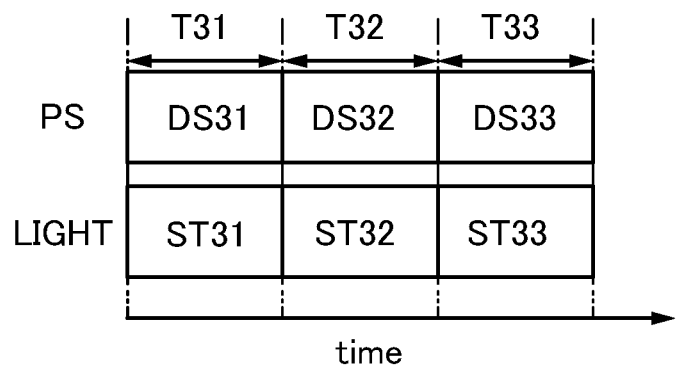

Another example of a driving method of a photodetector in the case where a light source of the light unit 102 includes plural-color-light-emitting diodes is described with reference to FIGS. 3A and 3B. FIGS. 3A and 3B are diagrams for describing the driving method of the photodetector illustrated in FIG. 1A. FIG. 3A is a flow chart, and FIG. 3B is a timing chart. Note that the case where a light source includes light-emitting diodes of three colors is described as an example.

In another example of the driving method of the photodetector illustrated in FIG. 1A, operation of generating a data signal DS31 (also referred to as generation of the data signal DS31) is performed as a step S31 as shown in FIG. 3A.

At this time, as in a period T31 shown in FIG. 3B, the light unit 102 is set to be in a first ON state (also referred to as a state ST31). Note that in the first ON state, a first-color-light-emitting diode emits light.

Further, the photodetector circuit 103p is set to be in a reset state in accordance with a reset signal. Then, the photodetector circuit 103p generates the data signal DS31 in accordance with a reading selection signal and outputs the data signal DS31.

The reading circuit 104 reads the data signal DS31. Data of the read data signal DS31 is stored in the memory circuit in the data processing circuit 105.

Next, as shown in FIG. 3A, operation of generating a data signal DS32 (also referred to as generation of the data signal DS32) is performed as a step S32.

At this time, as in a period T32 shown in FIG. 3B, the light unit 102 is set to be in a second ON state (also referred to as a state ST32). Note that in the second ON state, a second-color-light-emitting diode emits light.

Further, the photodetector circuit 103p generates and outputs the data signal DS32 as in the case of generation of the data signal DS31.

The reading circuit 104 reads the data signal DS32. Data of the read data signal DS32 is stored in the memory circuit in the data processing circuit 105.

Next, as shown in FIG. 3A, operation of generating a data signal DS33 (also referred to as generation of the data signal DS33) is performed as a step S33.

At this time, as in a period T33 shown in FIG. 3B, the light unit 102 is set to be in a third ON state (also referred to as a state ST33). Note that in the third ON state, a third-color-light-emitting diode emits light.

The photodetector circuit 103p generates and outputs the data signal DS33 as in the case of generation of the data signal DS31.

The reading circuit 104 reads the data signal DS33. Data of the read data signal DS33 is stored in the memory circuit in the data processing circuit 105.

As shown in FIG. 3A, operation of generating a data signal DS41 (also referred to as generation of the data signal DS41) is performed as a step S41. The operation of generating the data signal DS41 is performed before the operation of generating the data signal DS31 or after the operation of generating the data signal DS33.

At this time, the light unit 102 is set to be in an OFF state.

The photodetector circuit 103p generates and outputs the data signal DS41 as in the case of generation of the data signal DS31.

Further, the reading circuit 104 reads the data signal DS41. Data of the read data signal DS41 is stored in the memory circuit in the data processing circuit 105.

Next, as shown in FIG. 3A, operation of comparing a plurality of data signals is performed as a step S51.

At this time, in the data processing circuit 105, the data of the data signal DS41 is compared by the arithmetic circuit with each piece of data of the data signals DS31 to DS33 stored in the memory circuit, so that a difference data signal DDS31 which is data of a difference between the data signal DS31 and the data signal DS41, a difference data signal DDS32 which is data of a difference between the data signal DS32 and the data signal DS41, and a difference data signal DDS33 which is data of a difference between the data signal DS33 and the data signal DS41 are generated. The three generated difference data signals are used as data signals for executing predetermined processing.

Note that the periods T31 to T33 are not necessarily provided in succession. A period during which the light unit 102 is in an OFF state may be provided between the periods adjacent to each other.

An advantage of generating a difference data signal is described with reference to FIGS. 4A to 4D. FIGS. 4A to 4D are diagrams for describing the photodetector of this embodiment.

Figure 4A:
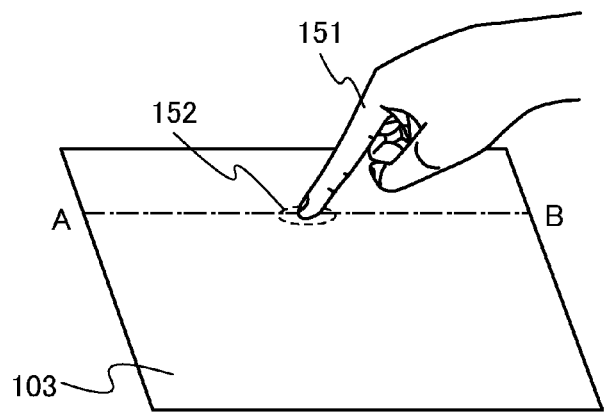
FIGS. 4A to 4D are diagrams showing a photodetector in Embodiment 1.

FIG. 4A is a schematic view for describing the photodetector of this embodiment. Here, as illustrated in FIG. 4A, the case where a finger 151 is in contact with a region 152 which is part of a photodetection portion 103 provided with a plurality of photodetector circuits is described. A white light-emitting diode is used here as a light source of the light unit 102.

Figure 4B:
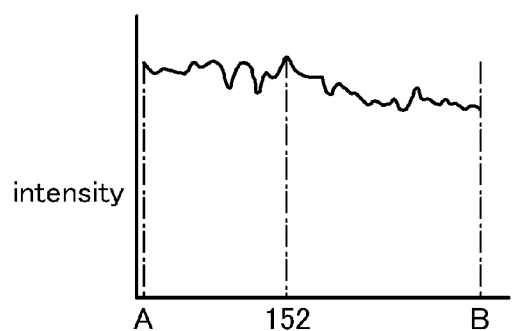

FIG. 4B shows an example of distribution of light intensity at line A-B in the photodetection portion 103 when the light unit 102 of the photodetector is in an ON state. In FIG. 4B, the horizontal axis indicates a position on the line A-B, and the vertical axis indicates relative intensity (also referred to as intensity) of incident light. As shown in FIG. 4B, when the light unit 102 is in an ON state, a difference is small between light intensity incident on the region 152 and light intensity incident on a region other than the region 152, and it is difficult to distinguish reflective light of the finger 151 from external light.

Figure 4C:
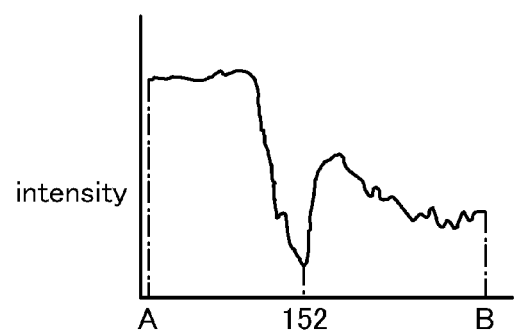

FIG. 4C shows an example of distribution of light intensity at the line A-B when the light unit 102 is in an OFF state. In FIG. 4C, the horizontal axis indicates a position on the line A-B, and the vertical axis indicates relative intensity of incident light. As shown in FIG. 4C, when the light unit 102 is in an OFF state, intensity of light incident on the region 152 is significantly lower than intensity of light incident on the region other than the region 152, and it is difficult to detect light reflected by the finger 151.

Figure 4D:
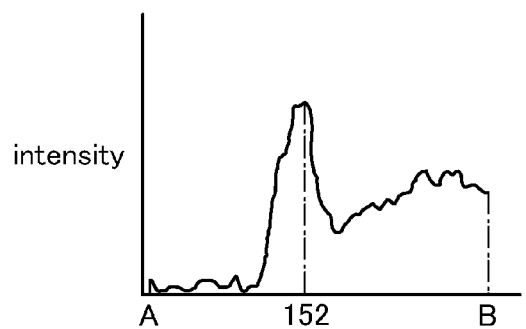

FIG. 4D shows an example of distribution of light intensity, at the line A-B, which is a difference between the data signal at the time when the light unit 102 is in an ON state and the data signal at the time when the light unit 102 is in an OFF state. In FIG. 4D, the horizontal axis indicates a position on the line A-B, and the vertical axis indicates relative intensity of incident light. As shown in FIG. 4D, after data on external light of the data signal is removed, intensity of light incident on the region 152 is higher than intensity of light incident on the region other than the region 152. In addition, a difference between intensity of light incident on the region 152 and intensity of light incident on the region other than the region 152 is larger than that in FIG. 4B. Thus, light reflected by the finger 151 can be discriminated from external light.

As described with FIGS. 1A to 1C, FIGS. 2A and 2B, FIGS. 3A and 3B, and FIGS. 4A to 4D, the photodetector exemplified in this embodiment includes the light unit and the photodetector circuit. The state of the light unit is switched between the ON state and the OFF state, and data signals generated by the photodetector circuit in the ON state and the OFF state are compared, so that a difference data signal is generated. By generation of the difference data signal, data on external light can be removed from the data signal which is a voltage corresponding to illuminance of light; thus, influence of external light can be reduced.

In the photodetector exemplified in this embodiment, even in the case where a light source of the light unit includes plural-color-light-emitting diodes, the state of each light-emitting diode is switched between an ON state and an OFF state, and the ON state and the OFF state in each light-emitting diode are compared, so that a difference data signal can be generated. With the above-described structure, by a method where color of light emitted from light-emitting diodes differs per period (also referred to as a field sequential method), an object to be read can be detected in full color, and influence of external light can be reduced.

(Embodiment 2)

In this embodiment, an example of the light unit of the photodetector in Embodiment 1 will be described.

Figure 5:
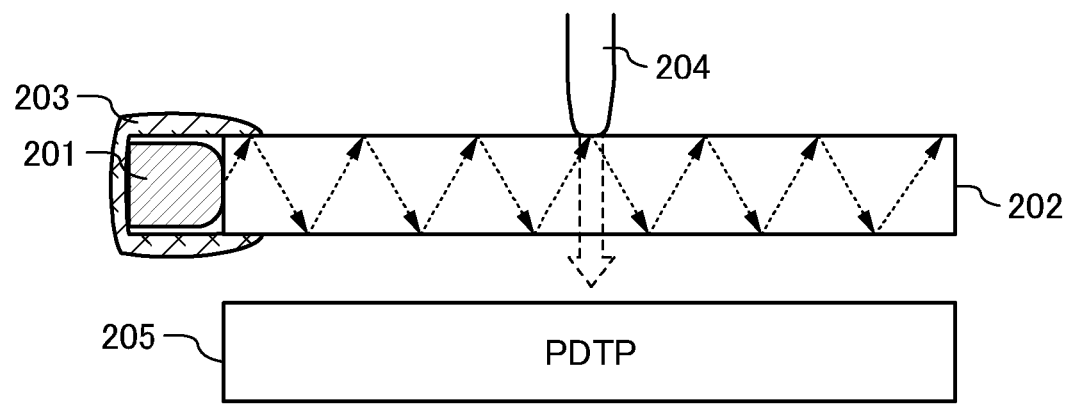
FIG. 5 is a schematic view illustrating a structural example of a light unit in Embodiment 2.

A structural example of a light unit in this embodiment is described with reference to FIG. 5. FIG. 5 is a schematic view illustrating the structural example of the light unit in this embodiment.

The light unit illustrated in FIG. 5 includes a light source 201, a light guide plate 202, and a fixing member 203. Further, the light unit in FIG. 5 overlaps with a photodetector circuit in a photodetection portion (also referred to as PDTP) 205.

As the light source 201, a light-emitting diode or the like can be used, for example, as in the case of Embodiment 1.

The fixing member 203 has a function of fixing the light source 201 and the light guide plate 202. As the fixing member 203, it is preferable to use a material having a light-blocking property. With use of a light-blocking material for the fixing member 203, leakage of light emitted from the light source 201 to the outside can be suppressed. Note that the fixing member 203 is not necessarily provided.

In the light unit illustrated in FIG. 5, light from the light source 201 is reflected inside the light guide plate 202. At this time, an objected such as a finger 204 is in contact with the light guide plate 202, for example, whereby light from the light source 201 is reflected by the finger 204 and incident on the photodetector circuit in the photodetection portion 205.

Further, when the light unit in FIG. 5 is, for example, supplied with a control signal from the outside or provided with a control circuit, the state of the light source 201 can be switched.

As described with FIG. 5, in the light unit exemplified in this embodiment, light from the light source is reflected with use of the light guide plate, and when the object is in contact with the light guide plate, light reflected by the object is incident on the photodetector circuit. With the above structure, influence of external light can be suppressed.

(Embodiment 3)

In this embodiment, an example of a photodetector circuit in the photodetector of the above embodiment will be described.

Examples of the photodetector circuit in this embodiment are described with reference to FIGS. 6A to 6F. FIGS. 6A to 6F are diagrams for describing the example of the photodetector circuit of this embodiment.

Figure 6A:
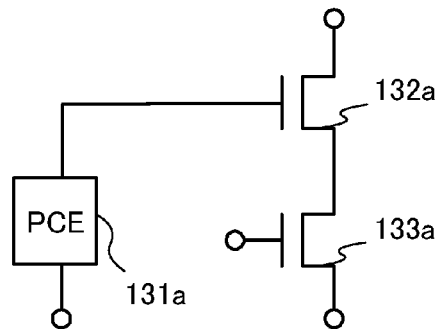
FIGS. 6A to 6F are diagrams showing examples of photodetector circuits in Embodiment 3.
Figure 6D:
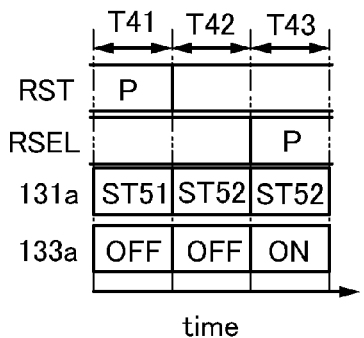
Figure 6B:
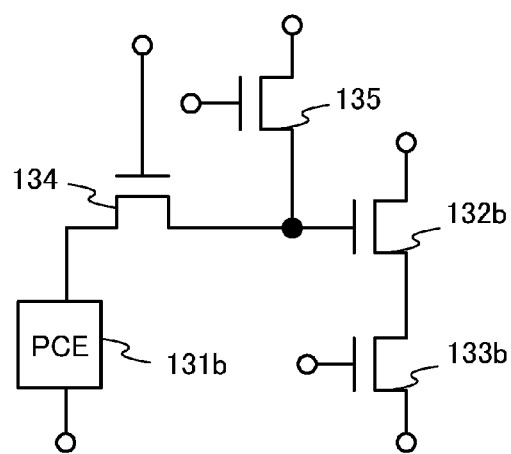
Figure 6E:
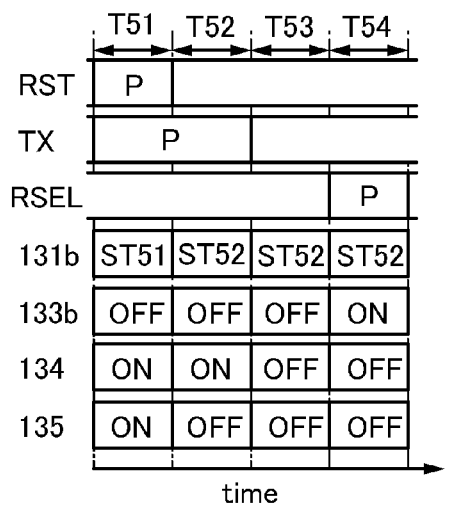
Figure 6C:
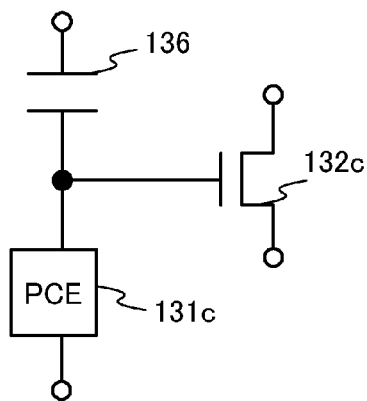

First, configuration examples of the photodetector circuit of this embodiment are described with reference to FIGS. 6A to 6C. FIGS. 6A to 6C are diagrams each showing the configuration example of the photodetector circuit of this embodiment.

The photodetector circuit in FIG. 6A includes a photoelectric conversion element 131a, a transistor 132a, and a transistor 133a.

The transistors of the photodetector circuit are field-effect transistors each having at least a source, a drain, and a gate unless otherwise specified.

The photoelectric conversion element 131a has a first terminal and a second terminal. A reset signal is inputted to the first terminal of the photoelectric conversion element 131a.

A gate of the transistor 132a is electrically connected to the second terminal of the photoelectric conversion element 131a.

One of a source and a drain of the transistor 133a is electrically connected to one of a source and a drain of the transistor 132a. A reading selection signal is inputted to a gate of the transistor 133a.

A voltage Va is inputted to either the other of the source and the drain of the transistor 132a or the other of the source and the drain of the transistor 133a.

In addition, the photodetector circuit in FIG. 6A outputs the voltage of the other of the source and the drain of the transistor 132a or the voltage of the other of the source and the drain of the transistor 133a, as a data signal.

The photodetector circuit in FIG. 6B includes a photoelectric conversion element 131b, a transistor 132b, a transistor 133b, a transistor 134, and a transistor 135.

The photoelectric conversion element 131b has a first terminal and a second terminal. A voltage Vb is inputted to the first terminal of the photoelectric conversion element 131b.

Note that one of the voltage Va and the voltage Vb is a high power supply voltage Vdd, and the other is a low power supply voltage Vss. The high power supply voltage Vdd is a voltage the value of which is relatively higher than that of the low power supply voltage Vss. The low power supply voltage Vss is a voltage the value of which is relatively lower than that of the high power supply voltage Vdd. The value of the voltage Va and the value of the voltage Vb might interchange depending, for example, on the conductivity type of the transistor. The difference between the voltage Va and the voltage Vb is a power supply voltage.

An accumulation control signal (also referred to as a signal TX) is inputted to a gate of the transistor 134. One of a source and a drain of the transistor 134 is electrically connected to the second terminal of the photoelectric conversion element 131b.

A gate of the transistor 132b is electrically connected to the other of the source and the drain of the transistor 134.

A reset signal is inputted to a gate of the transistor 135. The voltage Va is inputted to one of a source and a drain of the transistor 135. The other of the source and the drain of the transistor 135 is electrically connected to the other of the source and the drain of the transistor 134.

A reading selection signal is inputted to a gate of the transistor 133b. One of a source and a drain of the transistor 133b is electrically connected to one of a source and a drain of the transistor 132b.

The voltage Va is inputted to either the other of the source and the drain of the transistor 132b or the other of the source and the drain of the transistor 133b.

In addition, the photodetector circuit in FIG. 6B outputs either the voltage of the other of the source and the drain of the transistor 132b or the voltage of the other of the source and the drain of the transistor 133b, as a data signal.

The photodetector circuit in FIG. 6C includes a photoelectric conversion element 131c, a transistor 132c, and a capacitor 136.

The photoelectric conversion element 131c has a first terminal and a second terminal. The reset signal is inputted to the first terminal of the photoelectric conversion element 131c.

The capacitor 136 has a first terminal and a second terminal. The reading selection signal is inputted to the first terminal of the capacitor 136. The second terminal of the capacitor 136 is electrically connected to the second terminal of the photoelectric conversion element 131c.

A gate of the transistor 132c is electrically connected to the second terminal of the photoelectric conversion element 131c. The voltage Va is inputted to one of a source and a drain of the transistor 132c.

The photodetector circuit in FIG. 6C outputs the voltage of the other of the source and the drain of the transistor 132c, as a data signal.

Further, described are components of the photodetector circuits in FIGS. 6A to 6C.

The photoelectric conversion elements 131a to 131c each have a function of generating a current corresponding to the illuminance of incident light when light enters the photoelectric conversion element. As the photoelectric conversion elements 131a to 131c, photodiodes, phototransistors, or the like can be used. When the photoelectric conversion elements 131a to 131c are photodiodes, one of an anode and a cathode of the photodiode corresponds to the first terminal of the photoelectric conversion element, and the other of the anode and the cathode of the photodiode corresponds to the second terminal of the photoelectric conversion element. When the photoelectric conversion elements 131a to 131c are phototransistors, one of a source and a drain of the phototransistor corresponds to the first terminal of the photoelectric conversion element, and the other of the source and the drain of the phototransistor corresponds to the second terminal of the photoelectric conversion element.

The transistors 132a to 132c each have a function of an amplifying transistor for setting a value of a data signal of the photodetector circuit.

As the transistors 132a to 132c, it is possible to use transistors each including a semiconductor layer including a semiconductor belonging to Group 14 of the periodic table (e.g., silicon) or an oxide semiconductor layer, for example, as a layer in which a channel is formed. Note that a layer in which a channel is formed is also referred to as a channel formation layer.

The oxide semiconductor layer is an intrinsic (i-type) or substantially intrinsic semiconductor layer including extremely few carriers. The carrier concentration is lower than $1\times10^{14}/\text{cm}^3$, preferably lower than $1\times10^{12}/\text{cm}^3$, further preferably lower than $1\times10^{11}/\text{cm}^3$.

In the transistor including an oxide semiconductor layer functioning as a channel formation layer, the off-state current per micrometer of channel width is smaller than or equal to 10 aA ($1\times10^{-17}$ A), preferably smaller than or equal to 1 aA ($1\times10^{-18}$ A), further preferably smaller than or equal to 10 zA ($1\times10^{-20}$ A), still further preferably smaller than or equal to 1 zA ($1\times10^{-21}$ A), and still further preferably smaller than or equal to 100 yA ($1\times10^{-22}$ A).

The transistor 134 functions as an accumulation control transistor which controls, by being turned on or off in accordance with the accumulation control signal, whether to set the voltage of the gate of the transistor 132b to a voltage corresponding to a photocurrent generated by the photoelectric conversion element 131b. The accumulation control signal can be generated by a shift register, for example. Note that in the photodetector circuit of this embodiment, the transistor 134 is not necessarily provided; however, in the case of providing the transistor 134, the voltage of the gate of the transistor 132b can be held for a certain period of time when the gate of the transistor 132b is in a floating state.

The transistor 135 functions as a reset transistor which controls, by being turned on or off in accordance with the reset signal, whether to reset the voltage of the gate of the transistor 132b to the voltage Va. Note that in the photodetector circuit of this embodiment, the transistor 135 is not necessarily provided; however, in the case of providing the transistor 135, the voltage of the gate of the transistor 132b can be reset to the desired voltage.

As each of the transistor 134 and the transistor 135, for example, a transistor including an oxide semiconductor layer, which is applicable to the transistors 132a to 132c, can be used. With use of the transistor including an oxide semiconductor layer, change in the voltage of the gate of the transistor 132b, which is caused by the leakage current of the transistor 134 or the transistor 135, can be suppressed.

The transistor 133a and the transistor 133b each functions as a reading selection transistor which controls, by being turned on or off in accordance with the reading selection signal, whether to output the data signal from the photodetector circuit. As the transistor 133a and the transistor 133b, for example, a transistor which is applicable to the transistors 132a to 132c can be used.

Next, described are examples of driving methods of the photodetector circuits in FIGS. 6A to 6C.

First, the example of the driving method of the photodetector circuit in FIG. 6A is described with reference to FIG. 6D. FIG. 6D is a diagram for describing the example of the driving method of the photodetector circuit in FIG. 6A and shows states of the reset signal, the reading selection signal, the photoelectric conversion element 131a, and the transistor 133a. Note that the case where the photoelectric conversion element 131a is a photodiode is described as an example here.

In the example of the driving method of the photodetector circuit in FIG. 6A, a pulse of the reset signal is inputted in a period T41.

At this time, the photoelectric conversion element 131a is in a state where current flows in a forward direction (also referred to as a state ST51), and the transistor 133a is turned off.

Further, the voltage of the gate of the transistor 132a is reset to a certain value.

In a period T42 after the input of the pulse of the reset signal, the photoelectric conversion element 131a is set to be in a state where voltage is applied in a reverse direction (also referred to as a state ST52), and the transistor 133a remains in an off state.

At that time, a photocurrent flows between the first terminal and the second terminal of the photoelectric conversion element 131a in accordance with the illuminance of light incident on the photoelectric conversion element 131a. Further, the voltage value of the gate of the transistor 132a varies depending on the photocurrent.

Then, in the period T43, a pulse of the reading selection signal is inputted.

At that time, the photoelectric conversion element 131a remains in the state ST52, the transistor 133a is turned on, a current flows through the source and the drain of the transistor 132a and the source and the drain of the transistor 133a, and the photodetector circuit in FIG. 6A outputs as a data signal, either the voltage of the other of the source and the drain of the transistor 132a or the voltage of the other of the source and the drain of the transistor 133a. That is the example of the driving method of the photodetector circuit in FIG. 6A.

Next, the example of the driving method of the photodetector circuit in FIG. 6B is described with reference to FIG. 6E. FIG. 6E is a diagram for describing the example of the driving method of the photodetector circuit in FIG. 6B.

In the example of the driving method of the photodetector circuit in FIG. 6B, first, in a period T51, a pulse of the reset signal is inputted. In addition, in the period T51 and a period T52, a pulse of the accumulation control signal is inputted.

Note that in the period T51, the timing for starting input of the pulse of the reset signal may be earlier than the timing for starting input of the pulse of the accumulation control signal.

At that time, in the period T51, the photoelectric conversion element 131b is set to be in the state ST51, and the transistor 134 is turned on, whereby the voltage of the gate of the transistor 132b is reset to a value equivalent to the voltage Va.

Further in a period T52 after the input of the pulse of the reset signal, the photoelectric conversion element 131b is set to be in the state ST52, the transistor 134 remains in an on state, and the transistor 135 is turned off.

At that time, a photocurrent flows between the first terminal and the second terminal of the photoelectric conversion element 131b in accordance with the illuminance of light incident on the photoelectric conversion element 131b. Further, the voltage value of the gate of the transistor 132b varies depending on the photo current.

Further, in a period T53 after the input of the pulse of the accumulation control signal, the transistor 134 is turned off.

At that time, the voltage of the gate of the transistor 132b is kept to be a value corresponding to the photocurrent of the photoelectric conversion element 131b in the period T52. Note that the period T53 is not necessarily provided; however, in the case where there is the period T53, the timing of outputting a data signal in the photodetector circuit can be set appropriately. For example, the timing of outputting a data signal in each of the plurality of photodetector circuits can be set appropriately.

Then, in a period T54, a pulse of the reading selection signal is inputted.

At that time, the photoelectric conversion element 131b remains in the state ST52 and the transistor 133b is turned on.

Further, at that time, a current flows though the source and the drain of the transistor 132b and the source and the drain of the transistor 133b, and the photodetector circuit in FIG. 6B outputs as a data signal, either the voltage of the other of the source and the drain of the transistor 132b or the voltage of the other of the source and the drain of the transistor 133b. That is the example of the driving method of the photodetector circuit in FIG. 6B.

Figure 6F:
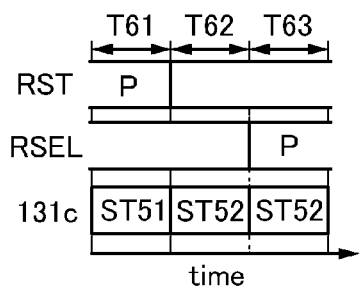

Next, the example of the driving method of the photodetector circuit in FIG. 6C is described with reference to FIG. 6F. FIG. 6F is a diagram for describing the example of the driving method of the photodetector circuit in FIG. 6C.

In the example of the driving method of the photodetector circuit in FIG. 6C, first, in a period T61, a pulse of the reset signal is inputted.

At that time, the photoelectric conversion element 131c is set to be the state ST51 and the voltage of the gate of the transistor 132c is reset to a certain value.

Then, in a period T62 after the input of the pulse of the reset signal, the photoelectric conversion element 131c is set to be the state ST52.

At that time, a photocurrent flows between the first terminal and the second terminal of the photoelectric conversion element 131c in accordance with the illuminance of light incident on the photoelectric conversion element 131c. Further, the voltage of the gate of the transistor 132c varies depending on the photocurrent.

Then, in a period T63, a pulse of the reading selection signal is inputted.

At that time, the photoelectric conversion element 131c remains in the state ST52, a current flows between the source and the drain of the transistor 132c, and the photodetector circuit in FIG. 6C outputs as a data signal, the voltage of the other of the source and the drain of the transistor 132c. That is the example of the driving method of the photodetector circuit in FIG. 6C.

As described with reference to FIGS. 6A to 6F, the photodetector circuit of this embodiment includes the photoelectric conversion element and the amplifying transistor. The photodetector circuit outputs a data signal in accordance with the reading selection signal. With the above structure, a data signal can be generated per period.

(Embodiment 4)

In this embodiment, described will be a photodetector that can output data and can input data when light enters the photodetector. Note that the photodetector that can output data and can input data when light enters the photodetector is also referred to as an input-output device.

Figure 7A:
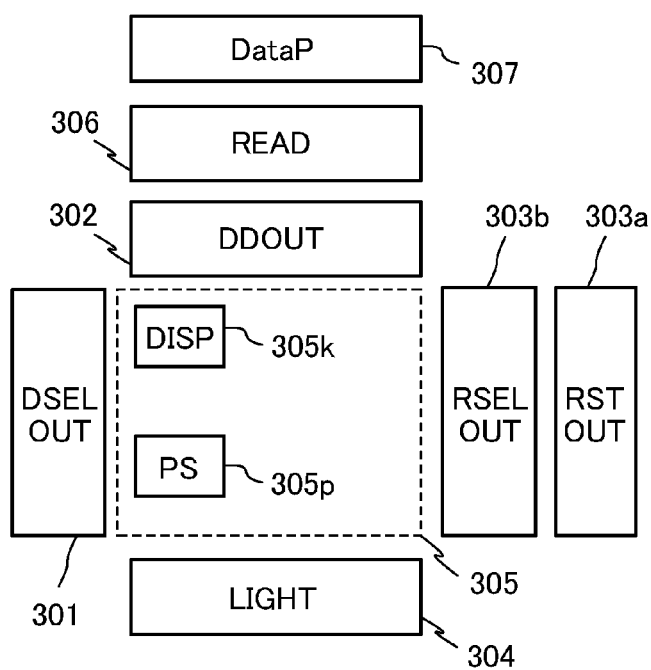
FIGS. 7A and 7B are diagrams showing an example of a photodetector circuit in Embodiment 4.
Figure 7B:
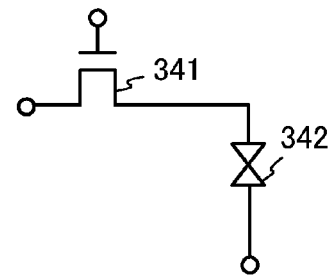

Next, an example of the photodetector in this embodiment will be described with reference to FIGS. 7A and 7B. FIGS. 7A and 7B are diagrams for describing the example of the photodetector in this embodiment.

First, a structural example of the photodetector in this embodiment will be described with reference to FIG. 7A. FIG. 7A is a block diagram illustrating the structural example of the photodetector in this embodiment.

The photodetector illustrated in FIG. 7A includes a display selection signal output circuit (also referred to as DSELOUT) 301, a display data signal output circuit (also referred to as DDOUT) 302, a reset signal output circuit (also referred to as RSTOUT) 303a, a reading selection signal output circuit (also referred to as RSELOUT) 303b, a light unit 304, X (X is a natural number) display circuits (also referred to as DISP) 305k, Y (Y is a natural number) photodetector circuits 305p, and a reading circuit 306.

The display selection signal output circuit 301 has a function of outputting a plurality of display selection signals (also referred to as signals DSEL).

The display selection signal output circuit 301 includes, for example, a shift register. The shift register outputs a pulse signal, whereby the display selection signal output circuit 301 can output a display selection signal.

An image signal is inputted to the display data signal output circuit 302. The display data signal output circuit 302 has a function of generating a display data signal (also referred to as a signal DD) based on the inputted image signal and outputting the generated display data signal.

The display data signal output circuit 302 includes, for example, a shift register, a memory circuit, and an analog switch. The shift register outputs a pulse signal, data of an image signal (also referred to as a signal IMG) is stored in the memory circuit in accordance with the pulse signal, and the analog switch is turned on, whereby the display data signal output circuit 302 can output the stored data of the image signal as a display data signal.

The reset signal output circuit 303a has a function of outputting a reset signal.

The reset signal output circuit 303a can have the same structure as the reset signal output circuit described in Embodiment 1, for example.

The reading selection signal output circuit 303b has a function of outputting a reading selection signal.

The reading selection signal output circuit 303b can have the same structure as the reading selection signal output circuit described in Embodiment 1, for example.

The light unit 304 includes a light source and has a function of lighting when the light source emits light.

The light unit 304 can have the same structure as the light unit described in Embodiment 1 or 2, for example.

In addition to the light unit 304, a light unit having the structure described in Embodiment 2 may be provided. For example, the light source of the light unit 304 has plural-color-light-emitting diodes, and a light source of the light unit additionally provided has an infrared emission diode, whereby full color display can be performed and light detection can be performed with high detection accuracy.

To the display circuit 305k, the display selection signal is inputted, and the display data signal is inputted in accordance with the inputted display selection signal. The display circuit 305k changes the display state in accordance with the inputted display data signal.

The display circuit 305k includes, for example, a selection transistor and a display element. The selection transistor controls whether to output the display data signal to the display element by being turned on or off in accordance with the display selection signal. The display element changes the display state in accordance with the inputted display data signal.

As the display element, a liquid crystal element, a light-emitting element, or the like can be used. A liquid crystal element is an element whose light transmittance is changed by voltage application, and a light-emitting element is an element whose luminance is controlled with a current or a voltage. As the light-emitting element, an electroluminescent element (also referred to as an EL element) or the like can be used.

Here, a configuration example of the display circuit 305k is described with reference to FIG. 7B. FIG. 7B is a circuit diagram showing a configuration example of the display circuit in the photodetector in FIG. 7A.

The display circuit shown in FIG. 7B includes a transistor 341 and a liquid crystal element 342.

The display data signal is inputted to one of a source and a drain of the transistor 341, and the display selection signal is inputted to a gate of the transistor 341.

The liquid crystal element 342 has a first terminal and a second terminal. The first terminal of the liquid crystal element 342 is electrically connected to the other of the source and the drain of the transistor 341. A common voltage is inputted to the second terminal of the liquid crystal element 342. The liquid crystal element 342 includes a pixel electrode functioning as the first terminal, a common electrode functioning as the second terminal, and a liquid crystal.

As the liquid crystal, for example, an electrically controlled birefringence liquid crystal (also referred to as an ECB liquid crystal), a liquid crystal to which dichroic pigment is added (also referred to as a GH liquid crystal), a polymer-dispersed liquid crystal, a discotic liquid crystal, or the like can be used. Note that as the liquid crystal, a liquid crystal exhibiting a blue phase may be used. The liquid crystal exhibiting a blue phase contains, for example, a liquid crystal composition including a liquid crystal exhibiting a blue phase and a chiral agent. The liquid crystal exhibiting a blue phase has a short response time of 1 msec or less, has optical isotropy, which makes the alignment process unneeded, and has a small viewing angle dependence. Therefore, with the liquid crystal exhibiting a blue phase, the operation speed can be increased.

Note that a capacitor may be provided in the display circuit. The capacitor has a first terminal and a second terminal. The first terminal of the capacitor is electrically connected to the other of the source and the drain of the transistor 341. A common voltage is inputted to the second terminal of the capacitor.

The capacitor functions as a storage capacitor which includes a first electrode functioning as part of or the whole of the first terminal, a second electrode functioning as part of or the whole of the second terminal, and a dielectric body. The capacitance of the capacitor may be set in consideration of the off-state current of the transistor 341.

In the case where the display circuit 305k has the configuration of FIG. 7B, the photodetector may employ a display method of a tranmissive mode, a semi-transmissive mode, or a reflective mode. As a display method of the photodetector in the case where the display circuit 305k has the configuration of FIG. 7B, a TN (twisted nematic) mode, an IPS (in-plane-switching) mode, a STN (super twisted nematic) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an ASV (advanced super view) mode, a FFS (fringe field switching) mode, or the like can be used.

The photodetector circuit 305p is provided in a pixel portion 305. The photodetector circuit 305p generates a voltage corresponding to illuminance of incident light. The reset signal and the reading selection signal are inputted to the photodetector circuit 305p. Further, the photodetector circuit 305p is set to be in a reset state in accordance with the reset signal. In addition, the photodetector circuit 305p has a function of outputting a data signal in accordance with the reading selection signal.

The photodetector circuit 305p can have the same structure as the photodetector circuit in the photodetector in Embodiment 1 (e.g., the photodetector circuit 103p in FIG. 1A). As the photodetector circuit 305p, the photodetector circuit described in Embodiment 3 can be used, for example.

A pixel includes at least one display circuit 305k. Alternatively, a pixel may include at least one display circuit 305k and at least one photodetector circuit 305p.

The reading circuit 306 selects the photodetector circuit 305p and reads the data signal from the selected photodetector circuit 305p.

The reading circuit 306 can have the same structure as the reading circuit in the photodetector in Embodiment 1, for example.

The data signal read out by the reading circuit 306 is processed by a data processing circuit 307 illustrated in FIG. 7A, for example.

The data processing circuit 307 is a circuit which performs arithmetic processing of the inputted data signal. The data processing circuit 307 can have the same structure as the data processing circuit in Embodiment 1.

Next, as an example of a driving method of the photodetector in this embodiment, an example of a driving method of the photodetector illustrated in FIG. 7A is described. Here, as an example, the display circuit 305k has the structure shown in FIG. 7B, and the light source of the light unit 304 includes light-emitting diodes of three colors of red, green, and blue.

For example, the driving method of the photodetector illustrated in FIG. 7A can be divided into reading operation and display operation.

In the reading operation, in a manner similar to that of the photodetector described in Embodiment 1, a state of the light unit 304 is changed to first to third ON states and OFF states, the photodetector circuit 305p generates a data signal in each state, each data signal is read by the reading circuit 306, and the data processing circuit 307 compares the data signals in the first to third ON states and the data signals in the OFF states. For details, the above description in Embodiment 1 is referred to.

In the display operation, the state of the light unit 304 changes to the first ON state, the second ON state, and the third ON state sequentially, and in each ON state, the transistor 341 is turned on in accordance with the display selection signal. At this time, voltage corresponding to the display data signal is applied to the liquid crystal element 342, so that the liquid crystal element 342 is set to be in a display state corresponding to the applied voltage. After that, the transistor 341 is turned off in accordance with the display selection signal. Note that the data signal generated in the previous reading period may be reflected to a display data signal and display operation may be performed in the display period.

As described with reference to FIGS. 7A and 7B, the photodetector of this embodiment includes the display circuit and the photodetector circuit. With the above structure, a display state of the display circuit can be set in accordance with the data signal generated by the photodetector circuit, so that the photodetector can function as a touch panel, for example.

In the photodetector of this embodiment, in the case where a light source includes plural-color-light-emitting diodes, the display operation and the reading operation can be performed by a field sequential method, for example. Accordingly, full-color display operation and reading operation can be performed without using a color filter, so that the number of display circuits in the pixel can be reduced.

(Embodiment 5)

In this embodiment, a transistor which can be used for the transistor including an oxide semiconductor layer of the above embodiment will be described.

The transistor including an oxide semiconductor layer described in this embodiment is a transistor including an oxide semiconductor layer which is highly purified to be intrinsic (also referred to as i-type) or substantially intrinsic. Note that high purification is a general idea including the following cases: the case where hydrogen in an oxide semiconductor layer is removed as much as possible; and the case where oxygen is supplied to an oxide semiconductor layer and defects due to oxygen deficiency of the oxide semiconductor layer are reduced.

An example of a structure of the transistor in this embodiment is described with reference to FIGS. 8A to 8D. FIGS. 8A to 8D are cross-sectional schematic views each illustrating an example of the structure of the transistor in this embodiment.

Figure 8A:
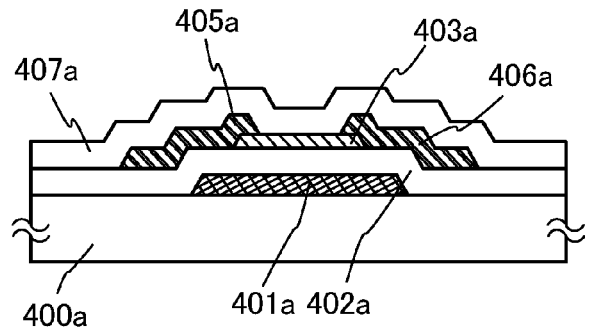
FIGS. 8A to 8D are cross-sectional schematic views each illustrating an example of a structure of a transistor in Embodiment 5.

The transistor illustrated in FIG. 8A is one of bottom-gate transistors, which is also referred to as an inverted staggered transistor.

The transistor illustrated in FIG. 8A includes a conductive layer 401a, an insulating layer 402a, an oxide semiconductor layer 403a, a conductive layer 405a, and a conductive layer 406a.

The conductive layer 401a is formed over a substrate 400a, the insulating layer 402a is formed over the conductive layer 401a, the oxide semiconductor layer 403a is formed over the conductive layer 401a with the insulating layer 402a interposed therebetween, and the conductive layer 405a and the conductive layer 406a are each formed over part of the oxide semiconductor layer 403a.

Further, in the transistor illustrated in FIG. 8A, an oxide insulating layer 407a is in contact with part of a top surface of the oxide semiconductor layer 403a (part of the oxide semiconductor layer 403a over which neither the conductive layer 405a nor the conductive layer 406a is provided).

Figure 8B:
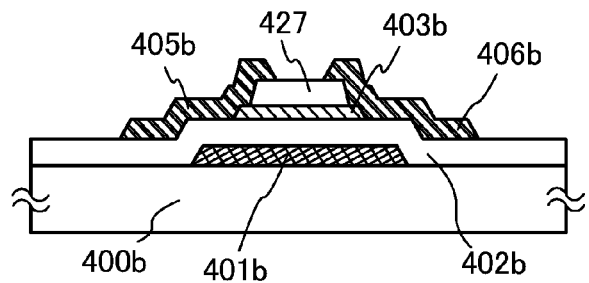

The transistor illustrated in FIG. 8B is a channel protective (also referred to as a channel stop) transistor which is one of the bottom-gate transistors, and is also referred to as an inverted staggered transistor.

The transistor illustrated in FIG. 8B includes a conductive layer 401b, an insulating layer 402b, an oxide semiconductor layer 403b, an insulating layer 427, a conductive layer 405b, and a conductive layer 406b.

The conductive layer 401b is formed over a substrate 400b, the insulating layer 402b is formed over the conductive layer 401b, the oxide semiconductor layer 403b is formed over the conductive layer 401b with the insulating layer 402b interposed therebetween, the insulating layer 427 is formed over the conductive layer 401b with the insulating layer 402b and the oxide semiconductor layer 403b interposed therebetween, and the conductive layer 405b and the conductive layer 406b are formed over part of the oxide semiconductor layer 403b with the insulating layer 427 interposed therebetween. The conductive layer 401b can overlap with the whole oxide semiconductor layer 403b. When the conductive layer 401b overlaps with the whole oxide semiconductor layer 403b, light entering the oxide semiconductor layer 403b can be suppressed. The structure thereof is not limited to this; the conductive layer 401b can overlap with part of the oxide semiconductor layer 403b.

Figure 8C:
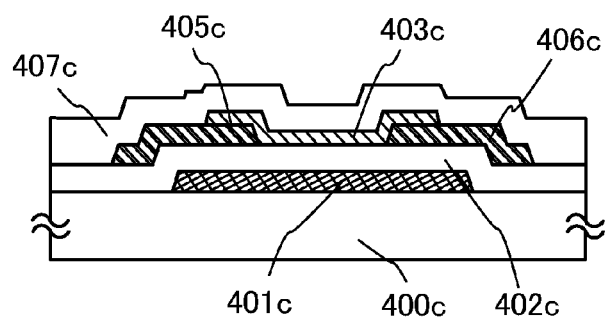

The transistor illustrated in FIG. 8C is one of the bottom-gate transistors.

The transistor illustrated in FIG. 8C includes a conductive layer 401c, an insulating layer 402c, an oxide semiconductor layer 403c, a conductive layer 405c, and a conductive layer 406c.

The conductive layer 401c is formed over a substrate 400c, the insulating layer 402c is formed over the conductive layer 401c, the conductive layer 405c and the conductive layer 406c are formed over part of the insulating layer 402c, and the oxide semiconductor layer 403c is formed over the conductive layer 401c with the insulating layer 402c, the conductive layer 405c, and the conductive layer 406c interposed therebetween. The conductive layer 401c can overlap with the whole oxide semiconductor layer 403c. When the conductive layer 401c overlaps with the whole oxide semiconductor layer 403c, light entering the oxide semiconductor layer 403c can be suppressed. The structure thereof is not limited to this; the conductive layer 401c can overlap with part of the oxide semiconductor layer 403c.

Further, in the transistor illustrated in FIG. 8C, an oxide insulating layer 407c is in contact with an upper surface and a side surface of the oxide semiconductor layer 403c.

Note that in FIGS. 8A to 8C, a protective insulating layer may be provided over the oxide insulating layer.

Figure 8D:
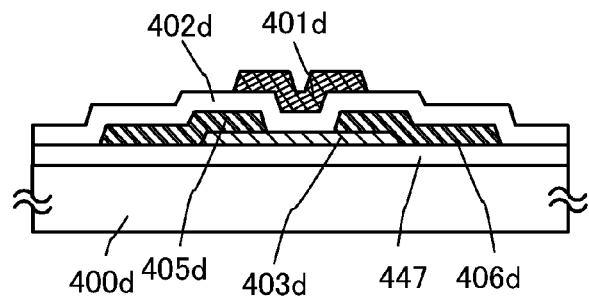

The transistor illustrated in FIG. 8D is one of top-gate transistors.

The transistor illustrated in FIG. 8D includes a conductive layer 401d, an insulating layer 402d, an oxide semiconductor layer 403d, a conductive layer 405d, and a conductive layer 406d.

The oxide semiconductor layer 403d is formed over a substrate 400d with an insulating layer 447 interposed therebetween, the conductive layer 405d and the conductive layer 406d are each formed over part of the oxide semiconductor layer 403d, the insulating layer 402d is formed over the oxide semiconductor layer 403d, the conductive layer 405d, and the conductive layer 406d, and the conductive layer 401d is formed over the oxide semiconductor layer 403d with the insulating layer 402d interposed therebetween.

Further, components illustrated in FIGS. 8A to 8D are described.

As the substrates 400a to 400d, a glass substrate of barium borosilicate glass, aluminoborosilicate glass, or the like can be used, for example.

Further alternatively, crystallized glass can be used as the substrates 400a to 400d. Further alternatively, a plastic substrate can be used for the substrates 400a to 400d.

The insulating layer 447 serves as a base layer preventing diffusion of an impurity element from the substrate 400d. The insulating layer 447 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 447 can be a stack of layers each using any of the materials applicable to the insulating layer 447. Alternatively, the insulating layer 447 can be a stack of a layer using a light-blocking material and a layer using any of the above materials applicable to the insulating layer 447. When the insulating layer 447 is formed using a layer using a light-blocking material, light entering the oxide semiconductor layer 403d can be suppressed.

Note that in the transistors illustrated in FIGS. 8A to 8C, an insulating layer may be provided between the substrate and the conductive layer serving as a gate electrode, as in the transistor illustrated in FIG. 8D.

The conductive layers 401a to 401d each function as a gate electrode of the transistor. As the conductive layers 401a to 401d, it is possible to use, for example, a layer of a metal material such as molybdenum, titanium, chromium, tantalum, tungsten, aluminum, copper, neodymium, or scandium or an alloy material containing any of these materials as a main component. The conductive layers 401a to 401d can also be formed by stacking layers of materials which can be applied to the conductive layers 401a to 401d.

The insulating layers 402a to 402d each function as a gate insulating layer of the transistor. As the insulating layers 402a to 402c, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layers 402a to 402c can also be formed by stacking layers of materials which can be used for the insulating layers 402a to 402c. The oxide insulating layer 402d can be an oxide insulating layer e.g., a silicon oxide layer.

The oxide semiconductor layers 403a to 403d each function as a channel formation layer of the transistor. As an oxide semiconductor which can be used for the oxide semiconductor layers 403a to 403d, for example, a four-component metal oxide, a three-component metal oxide, a two-component metal oxide, or the like can be given. As the four-component metal oxide, an In—Sn—Ga—Zn—O-based metal oxide or the like can be used, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example. As the two-component metal oxide, for example, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Sn—O-based metal oxide can be used. In addition, an In—O-based metal oxide, a Sn—O-based metal oxide, a Zn—O-based metal oxide, or the like can also be used as the oxide semiconductor. The metal oxide that can be used as the oxide semiconductor may contain $SiO_2$.

In the case of using an In—Zn—O-based metal oxide, for example, an oxide target which has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio) can be used for formation. For example, when a target used for forming the In—Zn—O-based oxide semiconductor has a composition ratio of In:Zn:O=P:Q:R in an atomic ratio, R>(1.5P+Q). An increase in the amount of indium enables mobility of the transistor to increase.

As the oxide semiconductor, a material represented by $InMO_3(ZnO)_m$ (m is larger than 0) can be used. Here, M represents one or more metal elements selected from Ga, Al, Mn, and Co. For example, Ga, Ga and Al, Ga and Mn, Ga and Co, and the like can be given as M.

Each of the conductive layers 405a to 405d and each of the conductive layers 406a to 406d function as a source electrode or a drain electrode of the transistor. As the conductive layers 405a to 405d and the conductive layers 406a to 406d, a layer of a metal material such as aluminum, chromium, copper, tantalum, titanium, molybdenum, or tungsten or an alloy material containing any of the metal materials as a main component can be used, for example. The conductive layers 405a to 405d and the conductive layers 406a to 406d can also be formed by stacking layers of materials which can be applied to the conductive layers 405a to 405d and the conductive layers 406a to 406d.

For example, the conductive layers 405a to 405d and the conductive layers 406a to 406d can be formed by stacking a metal layer of aluminum or copper and a high-melting-point metal layer of titanium, molybdenum, tungsten, or the like. The conductive layers 405a to 405d and the conductive layers 406a to 406d may have a structure in which a metal layer of aluminum or copper is provided between a plurality of high-melting-point metal layers. Further, when the conductive layers 405a to 405d and the conductive layers 406a to 406d are formed using an aluminum layer to which an element that prevents generation of hillocks or whiskers (e.g., Si, Nd, or Sc) is added, heat resistance can be increased.

Alternatively, each of the conductive layers 405a to 405d and the conductive layers 406a to 406d can be a layer containing a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide can be used, for example.

Furthermore, another wiring may be formed using the material used to form the conductive layers 405a to 405d and the conductive layers 406a to 406d.

The insulating layer 427 functions as a layer protecting the channel formation layer (also referred to as a channel protection layer) of the transistor, and a layer of a material applicable to the insulating layer 447 can be used for example, as the insulating layer 427. The insulating layer 427 can also be formed by stacking layers of materials which can be applied to the insulating layer 427.

As the oxide insulating layer 407a and the oxide insulating layer 407c, an oxide insulating layer can be used and, for example, a silicon oxide layer or the like can be used. The oxide insulating layer 407a and the oxide insulating layer 407c can also be formed by stacking layers of materials which can be applied to the oxide insulating layer 407a and the oxide insulating layer 407c.

Next, as an example of a method for manufacturing the transistor in this embodiment, an example of a method for manufacturing the transistor illustrated in FIG. 8A will be described with reference to FIGS. 9A to 9D. FIGS. 9A to 9D are schematic cross-sectional views illustrating the example of the method for manufacturing the transistor in FIG. 8A.

First, the substrate 400a is prepared and a first conductive film is formed thereover. The first conductive film is selectively etched to form the conductive layer 401a (see FIG. 9A).

For example, a first resist mask is formed over part of the first conductive film by a first photolithography step and the first conductive film is etched using the first resist mask to form the conductive layer 401a. Note that the first resist mask is removed after the conductive layer 401a is formed.

For example, the first conductive film can be formed using a material that can be used for the conductive layer 401a. The first conductive film can be formed by stacking layers each formed of a material that can be used for the first conductive film.

Note that the resist mask may be formed by an inkjet method. A photomask is not used in an inkjet method; thus, manufacturing cost can be reduced. Further, the resist mask may be formed using a multi-tone mask. A multi-tone mask is a mask through which light is transmitted to have a plurality of intensities. When a multi-tone mask is used, a resist mask having portions with different thicknesses can be formed and such a resist mask can be used for plural etching steps; therefore, manufacturing cost can be reduced.

Then, a first insulating film is formed over the conductive layer 401a to form the insulating layer 402a. An oxide semiconductor film is formed over the insulating layer 402a, and then the oxide semiconductor film is etched and subjected to a first heat treatment, whereby the oxide semiconductor layer 403a is formed (see FIG. 9B).

For example, the first insulating film can be formed by a sputtering method, a plasma CVD method, or the like. For example, when the first insulating film is formed by a high-density plasma CVD method (e.g., a high-density plasma CVD method using microwaves at a frequency of 2.45 GHz), the insulating layer 402a can be dense and thereby has an improved breakdown voltage.

Further, the first insulating film can be formed using a material that can be used for the insulating layer 402a. The first insulating film can be formed by stacking layers each formed of a material that can be used for the first insulating film.

The oxide semiconductor film can be formed by a sputtering method. Note that the oxide semiconductor film may be formed in a rare gas atmosphere, an oxygen atmosphere, or in a mixed atmosphere of a rare gas and oxygen.

The oxide semiconductor film can be formed using an oxide semiconductor material that can be used for the oxide semiconductor layer 403a.

For the formation of the oxide semiconductor film, an oxide target having a composition ratio, $In_2O_3:Ga_2O_3:ZnO=1:1:1$ or $In_2O_3:Ga_2O_3:ZnO=1:1:2$ in molar ratio, can be used. The filling factor of the oxide target to be used is preferably higher than or equal to 90% and lower than or equal to 100%, further preferably higher than or equal to 95% and lower than or equal to 99.9%. Here, the filling factor means the proportion of the volume of a portion except for an area occupied by a space and the like with respect to the total volume of the oxide target. With a target having a high filling factor, a dense oxide semiconductor film can be formed.

Further, as a sputtering gas used for forming the oxide semiconductor film, for example, a high-purity gas from which an impurity such as hydrogen, water, a hydroxyl group, or a hydride is removed is preferably used.

Before the formation of the oxide semiconductor film, pre-heating may be performed. By pre-heating, an impurity such as hydrogen or moisture is released from the insulating layer 402a and the oxide semiconductor film. Note that in the case of performing pre-heating in a pre-heating chamber, a cryopump is preferably provided as an evacuation device in the pre-heating chamber, for example.

Further, the oxide semiconductor film may be formed while the substrate 400a is placed under reduced pressure and the temperature of the substrate 400a is set higher than or equal to 100° C. and lower than or equal to 600° C., preferably higher than or equal to 200° C. and lower than or equal to 400° C. By heating the substrate 400a, the concentration of the impurity in the oxide semiconductor film can be reduced and damage to the oxide semiconductor film during the sputtering can be reduced.

Further, moisture remaining in a deposition chamber where the oxide semiconductor film is formed can be removed with an entrapment vacuum pump or the like, for example. As the entrapment vacuum pump, a cryopump, an ion pump, or a titanium sublimation pump can be used, for example. Further, a turbo pump provided with a cold trap can be used to remove moisture remaining in the deposition chamber.

Before the formation of the oxide semiconductor film, reverse sputtering is preferably performed to remove powdery substances (also referred to as particles or dust) attached on a surface of the insulating layer 402a. The reverse sputtering refers to a method in which, instead of applying a voltage to a target side, an RF power source is used for applying a voltage to a substrate side in an argon, nitrogen, helium, or oxygen atmosphere so that plasma is generated to modify a surface of the substrate.

The oxide semiconductor film can be etched using a second resist mask which is formed over part of the oxide semiconductor film by a second photolithography step, for example. Note that the second resist mask is removed after the oxide semiconductor film is etched.

Dry etching, wet etching, or both dry etching and wet etching can be employed for etching the oxide semiconductor film, for example. The oxide semiconductor film can be etched, for example, using a mixed solution of phosphoric acid, acetic acid, and nitric acid as an etchant. ITO07N (produced by Kanto Chemical Co., Inc.) may be used as an etchant for etching the oxide semiconductor film.

In addition, the first heat treatment is performed at higher than or equal to 400° C. and lower than or equal to 750° C., or higher than or equal to 400° C. and lower than the strain point of the substrate, for example. Through the first heat treatment, dehydration or dehydrogenation can be performed.

A heat treatment apparatus for the heat treatment may be an electric furnace or an apparatus for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating the object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp, for example. A GRTA apparatus is an apparatus for heat treatment using a high-temperature gas. As the high-temperature gas, a rare gas or an inert gas (e.g., nitrogen) which does not react with the object by the heat treatment can be used.

For example, as the first heat treatment, GRTA which includes heating for several minutes in an inert gas heated to 650° C. to 700° C. may be employed.

Note that it is preferable that water, hydrogen, and the like be not contained in a gas used in the first heat treatment. It is preferable that the gas have a purity of 6N (99.9999%) or more, preferably, 7N (99.99999%) or more, that is, it is preferable that the impurity concentration be lower than or equal to 1 ppm, more preferably, lower than or equal to 0.1 ppm.

After the oxide semiconductor layer is heated in the first heat treatment, a high-purity oxygen gas, a high-purity $N_2O$ gas, or ultra-dry air (having a dew point of lower than or equal to $-40°$ C., preferably lower than or equal to $-60°$ C.) may be introduced into the same furnace while the heating temperature is being maintained or being decreased. It is preferable that the oxygen gas or the $N_2O$ gas do not contain water, hydrogen, and the like. The purity of the oxygen gas or the $N_2O$ gas which is introduced into the heat treatment apparatus is preferably 6N or more, further preferably 7N or more, that is, the impurity concentration of the oxygen gas or the $N_2O$ gas is preferably lower than or equal to 1 ppm, more preferably lower than or equal to 0.1 ppm. Introduction of the oxygen gas or the $N_2O$ gas makes oxygen to be supplied to the oxide semiconductor layer 403a, whereby the oxide semiconductor layer 403a can be purified.

Note that the first heat treatment may be performed after the oxide semiconductor film is formed and etched. Alternatively, the oxide semiconductor film may be etched after the oxide semiconductor film is formed and the first heat treatment is performed.

In addition to the above timings, the first heat treatment may be performed after the conductive layers 405a and 406a are formed over the oxide semiconductor layer 403a or after the oxide insulating layer 407a is formed over the conductive layers 405a and 406a, as long as the first heat treatment is performed after the formation of the oxide semiconductor layer.

Alternatively, the oxide semiconductor film may be formed by two deposition steps and heat treatment may be performed after each deposition step so that the resulting oxide semiconductor film may include a crystalline region with the c-axis oriented perpendicularly to the film surface. For example, a first oxide semiconductor film with a thickness of greater than or equal to 3 nm and less than or equal to 15 nm is formed and subjected to first heat treatment at a temperature of higher than or equal to 450° C. and lower than or equal to 850° C., preferably higher than or equal to 550° C. and lower than or equal to 750° C. in an atmosphere of nitrogen, oxygen, a rare gas, or dry air, so that the first oxide semiconductor film includes a crystalline region (including a plate-like crystal) in a region including a surface; then, a second oxide semiconductor film which is thicker than the first oxide semiconductor film is formed and subjected to a second heat treatment at a temperature higher than or equal to 450° C. and lower than or equal to 850° C., preferably higher than or equal to 600° C. and lower than or equal to 700° C., so that crystals grow upward from the first oxide semiconductor film into the second oxide semiconductor film using the first oxide semiconductor film as a seed of crystal growth, whereby the whole of the second oxide semiconductor film is crystallized. In such a manner, the oxide semiconductor film including a crystalline region with the c-axis oriented perpendicularly to the film surface can be formed. The oxide semiconductor film thus formed is thicker than an oxide semiconductor film formed by one deposition step.

Figure 9A:
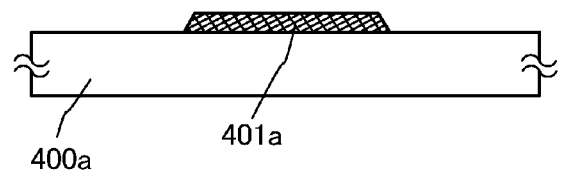
FIGS. 9A to 9D are cross-sectional schematic views illustrating an example of a method for manufacturing the transistor illustrated in FIG. 8A.
Figure 9B:
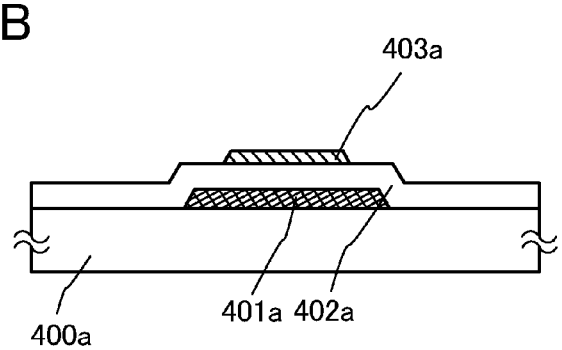
Figure 9C:
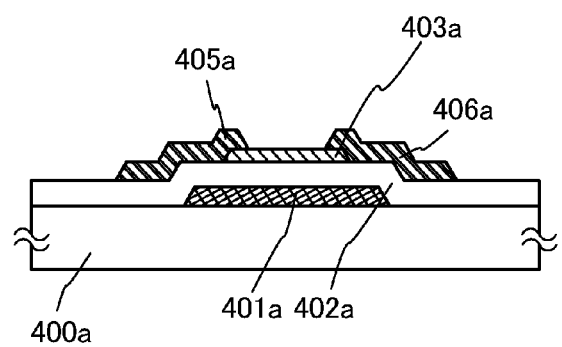

Then, a second conductive film is formed over the insulating layer 402a and the oxide semiconductor layer 403a and selectively etched to form the conductive layers 405a and 406a (see FIG. 9C).

For example, a third resist mask is formed over part of the second conductive film by a third photolithography step and the second conductive film is etched using the third resist mask to form the conductive layers 405a and 406a. Note that the third resist mask is removed after the conductive layers 405a and 406a are formed.

Further, the second conductive film can be formed using a material that can be used for the conductive layers 405a and 406a. The second conductive film can be formed by stacking layers each formed of a material that can be used for the second conductive film.

The second conductive film can be, for example, a film of a metal material such as aluminum, chromium, copper, tantalum, titanium, molybdenum, or tungsten; or a film of an alloy material containing any of these metal materials as a main component. The second conductive film can be a stack of films formed by stacking films that can be used as the second conductive film.

Note that the third resist mask is preferably formed by light exposure to ultraviolet rays, KrF laser light, or ArF laser light. A channel length L of the resulting transistor depends on the width of the interval between bottom ends of the conductive layers 405a and 406a which are adjacent to each other over the oxide semiconductor layer 403a. In the case where light exposure is performed to form the third resist mask which makes the channel length L less than 25 nm, the light exposure is preferably performed using extreme ultraviolet having an extremely short wavelength of several nanometers to several tens of nanometers. In the light exposure by extreme ultraviolet light, the resolution is high and the focal depth is large. Accordingly, the channel length L of the resulting transistor can be greater than or equal to 10 nm and less than or equal to 1000 nm.

After the conductive layers 405a and 406a are formed, pre-heating may be performed. This pre-heating may be performed similarly to the above one.

Then, the oxide insulating layer 407a is formed to be in contact with the oxide semiconductor layer 403a.

For example, the oxide insulating layer 407a can be formed by forming a second insulating film over the oxide semiconductor layer 403a, the conductive layer 405a, and the conductive layer 406a in a rare gas (typically, argon) atmosphere, an oxygen atmosphere, or a mixed atmosphere of a rare gas and oxygen, by a method (e.g., a sputtering method) in which an impurity such as water or hydrogen does not enter the oxide insulating layer 407a. By forming the oxide insulating layer 407a in which an impurity such as water or hydrogen does not enter the oxide insulating layer 407a, reduction in resistance of a back channel of the oxide semiconductor layer can be prevented. The temperature of the substrate in the formation of the oxide insulating layer 407a is preferably higher than or equal to room temperature and lower than or equal to 300° C.

The second insulating film may be formed using a silicon oxide target or a silicon target, for example. For example, with use of a silicon target, a silicon oxide film can be formed as the second insulating film by a sputtering method in an atmosphere containing oxygen.

Further, as a sputtering gas used for forming the second insulating film, for example, a high-purity gas from which an impurity such as hydrogen, water, a hydroxyl group, or a hydride is removed is preferably used.

Before the formation of the oxide insulating layer 407a, plasma treatment using a gas such as $N_2O$, $N_2$, or Ar may be performed to remove water or the like adsorbed on an exposed surface of the oxide semiconductor layer 403a. In the case of performing the plasma treatment, the oxide insulating layer 407a is preferably formed after the plasma treatment without exposure to air.

Then, a second heat treatment (preferably at higher than or equal to 200° C. and lower than or equal to 400° C., e.g., higher than or equal to 250° C. and lower than or equal to 350° C.) may be performed in an inert gas atmosphere or an oxygen gas atmosphere. For example, the second heat treatment is performed at 250° C. in a nitrogen atmosphere for one hour. By the second heat treatment, heat is applied while part of the upper surface of the oxide semiconductor layer 403a is in contact with the oxide insulating layer 407a.

Through the above process, an impurity such as hydrogen, moisture, a hydroxyl group, or a hydride (also referred to as a hydrogen compound) can be intentionally removed from the oxide semiconductor layer, and in addition, oxygen can be supplied to the oxide semiconductor layer. Therefore, the oxide semiconductor layer is highly purified.

Figure 9D:
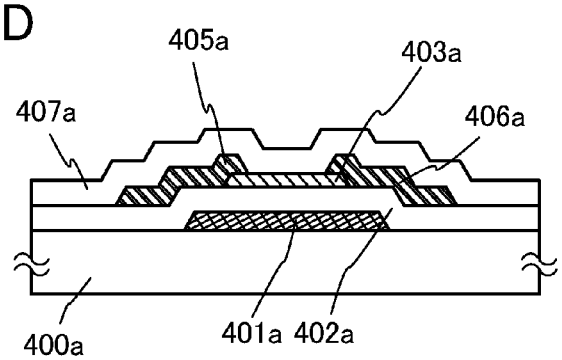

Through the above process, the transistor can be formed (see FIG. 9D).

When the oxide insulating layer 407a is a silicon oxide layer having many defects, an impurity such as hydrogen, moisture, a hydroxyl group, or a hydride in the oxide semiconductor layer 403a is diffused into the oxide insulating layer 407a by the second heat treatment, whereby the impurity in the oxide semiconductor layer 403a can be further reduced.

A protective insulating layer may be formed over the oxide insulating layer 407a. The protective insulating layer is provided by forming an insulating film by an RF sputtering method, for example. An RF sputtering method is preferable as a formation method of the protective insulating layer because it provides high mass productivity. The above is an example of a method for manufacturing the transistor in FIG. 8A.

Note that the method for manicuring the transistor in this embodiment may include an oxygen doping treatment using oxygen plasma. For example, an oxygen doping treatment using a high-density plasma of 2.45 GHz may be performed. Note that the oxygen doping treatment may be performed after the formation of the insulating layer serving as a gate insulating layer, after the formation of the oxide semiconductor film, after the first heat treatment, after the formation of the conductive layer serving as a source electrode or a drain electrode, or after the formation of the oxide insulating layer. By the oxygen doping treatment, variation in electrical characteristics of the transistors which are manufactured can be reduced.

Note that the given example of the method for manufacturing the transistor is not necessarily applied only to the transistor in FIG. 8A. For example, the above description of the example of the method for manufacturing the transistor in FIG. 8A can be applied as appropriate to the components of FIGS. 8B to 8D which have the same designations as the components of FIG. 8A and have a function at least partly the same as that of the components of FIG. 8A.

As is described with reference to FIGS. 8A to 8D and FIGS. 9A to 9D, the transistor in this embodiment has a structure including a first conductive layer functioning as a gate electrode, an insulating layer functioning as a gate insulating layer, an oxide semiconductor layer which includes a channel and overlaps with first conductive layer with the insulating layer interposed therebetween, a second conductive layer which is electrically connected to the oxide semiconductor layer and functions as one of a source electrode and a drain electrode, and a third conductive layer which is electrically connected to the oxide semiconductor layer and functions as the other of the source electrode and the drain electrode. The oxide semiconductor layer is in contact with an oxide insulating layer.

The oxide semiconductor layer in which a channel is formed is an oxide semiconductor layer which is made to be i-type or substantially i-type by purification. By purification of the oxide semiconductor layer, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$, and thus, change in characteristics due to temperature change can be suppressed. With the above structure, the off-state current per micrometer of the channel width can be less than or equal to 10 aA ($1 \times 10^{-17}$A), less than or equal to 1 aA ($1 \times 10^{-18}$A), less than or equal to 10 zA ($1 \times 10^{-20}$A), further less than or equal to 1 zA ($1 \times 10^{-21}$A), and furthermore less than or equal to 100 yA ($1 \times 10^{-22}$A). It is preferable that the off-state current of the transistor be as low as possible. The smallest value of the off-state current of the transistor in this embodiment is estimated to be about $10^{-30}$ A/μm.

In addition, an example will be described in which the off-state current of the transistor of this embodiment is calculated by measuring the leakage current with use of a circuit for evaluating characteristics.

Figure 10:
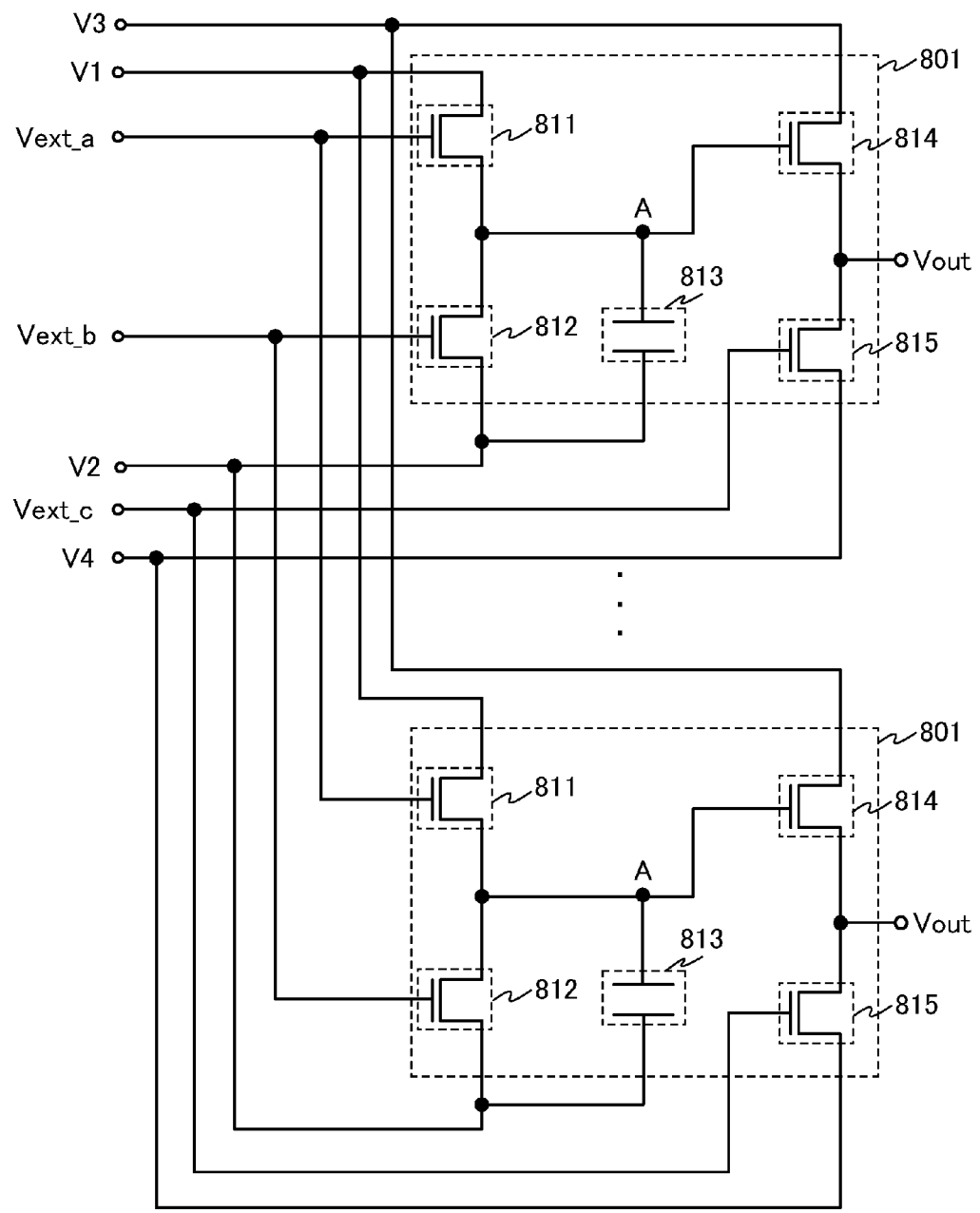
FIG. 10 is a circuit diagram showing a circuit for evaluating characteristics.

The configuration of the circuit for evaluating characteristics is described with reference to FIG. 10. FIG. 10 is a circuit diagram showing the configuration of the circuit for evaluating characteristics.

The circuit for evaluating characteristics shown in FIG. 10 includes a plurality of measurement systems 801. The plurality of measurement systems 801 are connected in parallel. Here, as an example, eight measurement systems 801 are connected in parallel.

The measurement system 801 includes a transistor 811, a transistor 812, a capacitor 813, a transistor 814, and a transistor 815.

A voltage V1 is inputted to one of a source and a drain of the transistor 811, and a voltage Vext_a is inputted to a gate of the transistor 811. The transistor 811 is for injection of electric charge.

One of a source and a drain of the transistor 812 is electrically connected to the other of the source and the drain of the transistor 811, a voltage V2 is input to the other of the source and the drain of the transistor 812, and a voltage Vext_b is input to a gate of the transistor 812. The transistor 812 is for evaluation of leakage current. Note that the leakage current refers to leakage current including the off-state current of the transistor.

A first electrode of the capacitor 813 is connected to the other of the source and the drain of the transistor 811, and a voltage V2 is inputted to a second electrode of the capacitor 813. Here, the voltage V2 is 0 V.

A voltage V3 is inputted to one of a source and a drain of the transistor 814, and a gate of the transistor 814 is electrically connected to the one of the source and the drain of the transistor 811. Note that a portion where the gate of the transistor 814, the other of the source and the drain of the transistor 811, the one of the source and the drain of the transistor 812, and the first electrode of the capacitor 813 are connected to each other is referred to as a node A. Here, the voltage V3 is 5 V.

One of a source and a drain of the transistor 815 is electrically connected to the other of the source and the drain of the transistor 814, a voltage V4 is inputted to the other of the source and the drain of the transistor 815, and a voltage Vext_c is inputted to a gate of the transistor 815. Here, the voltage Vext_c is 0.5 V.

The measurement system 801 outputs a voltage at a portion where the other of the source and the drain of the transistor 814 is connected to the one of the source and the drain of the transistor 815, as an output voltage Vout.

Here, as an example of the transistor 811, a transistor including an oxide semiconductor layer and having a channel length L of 10 μm and a channel width W of 10 μm is used. As an example of each of the transistor 814 and the transistor 815, a transistor including an oxide semiconductor layer and having a channel length L of 3 μm and a channel width W of 100 μm is used. Further, as an example of the transistor 812, a transistor having a bottom gate structure which includes an oxide semiconductor layer is used. In the transistor as an example of the transistor 812, a source electrode and a drain electrode are in contact with an upper part of the oxide semiconductor layer, a region where the source and drain electrodes overlap with a gate electrode is not provided, and an offset region with a width of 1 μm is provided. Provision of the offset region enables parasitic capacitance to be reduced. Further, as the transistor 812, six types of transistors having different conditions, i.e., channel lengths L and channel widths W which are different from each other, are used (see Table 1).

TABLE 1

| | Channel length L [μm] | Channel width W [μm] |
|---|---|---|
| Condition 1 | 1.5 | $1 \times 10^5$ |
| Condition 2 | 3 | $1 \times 10^5$ |
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

The transistor for injection of electric charge and the transistor for evaluation of leakage current are separately provided as shown in FIG. 10, so that the transistor for evaluation of leakage current can be always kept off while electric charge is injected. In the case where the transistor for injection of electric charge is not provided, the transistor for evaluation of leakage current needs to be turned on when the electric charge is injected. In such a case, if an element requires a long time to change the transistor from an on state to the steady state of the off state, it takes a long time for measurement.

Further, the transistor for injection of electric charge and the transistor for evaluation of leakage current are separately provided, whereby each transistor can have a proper size. When the channel width W of the transistor for evaluation of leakage current is larger than the channel width W of the transistor for injection of electric charge, the leakage current components of the circuit for evaluating characteristics except for the transistor for evaluation of leakage current can be relatively reduced. As a result, the leakage current of the transistor for evaluation of leakage current can be measured with high accuracy. In addition, the transistor for evaluation of leakage current does not need to be once turned on when the electric charge is injected; thus, the node A has no influence of change in voltage which is caused by some of the charges in the channel formation region which flow into the node A.

On the other hand, the channel width W of the transistor for injection of electric charge is smaller than the channel width W of the transistor for evaluation of leakage current, whereby the leakage current of the transistor for injection of electric charge can be relatively reduced. In addition, the node A has less influence of change in voltage which is caused by some of the charges in the channel formation region which flows in the node A when electric charge is injected.

As shown in FIG. 10, the plurality of measurement systems are connected in parallel, whereby the leakage current of the circuit for evaluating characteristics can be calculated more accurately.

Next, a method for calculating a value of the off-state current of the transistor in this embodiment with use of the circuit for evaluating characteristics in FIG. 10 is described.

Figure 11:
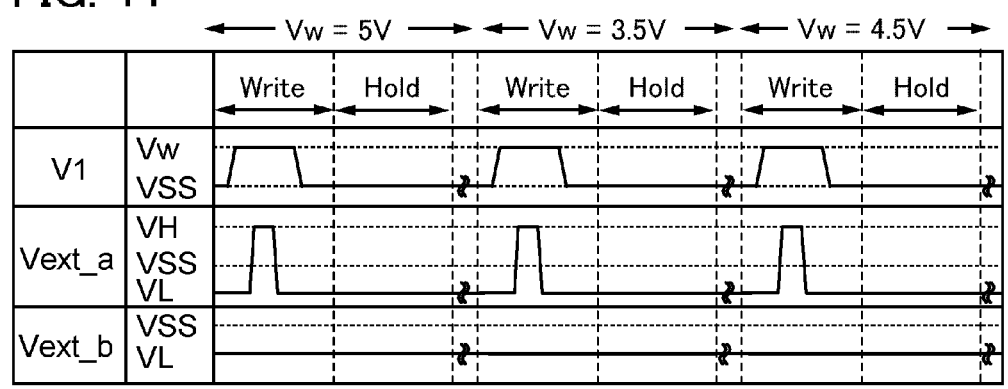
FIG. 11 is a timing chart for describing a method for measuring leakage current with use of the circuit for evaluating characteristics in FIG. 10.

First, a method for measuring a leakage current of the circuit for evaluating characteristics shown in FIG. 10 is described with reference to FIG. 11. FIG. 11 is a timing chart for describing the method for measuring the leakage current with use of the circuit for evaluating characteristics shown in FIG. 10.

In the measurement of the leakage current with use of the circuit for evaluating characteristics shown in FIG. 10, a writing period and the holding period are provided. The operation in each period is described below.

First, in the writing period, as the voltage Vext_b, the voltage VL (−3 V) with which the transistor 812 is turned off is inputted. As the voltage V1, the writing voltage Vw is input, and then, as the voltage Vext_a, the voltage VH (5 V) with which the transistor 811 is in an on state for a certain period is inputted. Thus, electric charge is accumulated in the node A, and the voltage of the node A becomes equivalent to the writing voltage Vw. Then, as the voltage Vext_a, a voltage VL with which the transistor 811 is turned off is inputted. Then, as the voltage V1, the voltage VSS (0 V) is applied.

In the following holding period, the amount of change in the voltage of the node A, caused by change in the amount of electric charge accumulated in the node A, is measured. From the amount of change in the voltage, the value of the current flowing between the source electrode and the drain electrode of the transistor 812 can be calculated. Thus, the electric charge of the node A can be accumulated, and the amount of change in the voltage of the node A can be measured.

Accumulation of electric charge of the node A and measurement of the amount of change in the voltage of the node A (also referred to as the accumulation and measurement operation) are repeatedly performed. First, a first accumulation and measurement operation is repeated 15 times. In the first accumulation and measurement operation, a voltage of 5 V as the writing voltage Vw is applied in the writing period, and retention for one hour is performed in the holding period. Next, a second accumulation and measurement operation is repeated twice. In the second accumulation and measurement operation, a voltage of 3.5 V as the writing voltage Vw is applied in the writing period, and retention for 50 hours is performed in the holding period. Next, a third accumulation and measurement operation is performed once. In the third accumulation and measurement operation, a voltage of 4.5 V as the writing voltage Vw is applied in the writing period, and retention for 10 hours is performed in the holding period. By repeating the accumulation and measurement operation, the measured current value can be confirmed to be the value in the steady state. In other words, the transient current (a current component which decreases over time after the measurement starts) can be removed from the current $I_A$ flowing in the node A. As a result, the leakage current can be measured with high accuracy.

In general, $V_A$ denoting the voltage of the node A can be measured as a function of the output voltage Vout and expressed by the following equation (1).

[FORMULA 1]

$$V_A = F(V\text{out}) \quad (1)$$

Electric charge $Q_A$ of the node A can be expressed by the following equation (2) using the voltage $V_A$ of the node A, capacitance $C_A$ connected to the node A, and a constant (const). Here, the capacitance $C_A$ connected to the node A is the sum of capacitance of the capacitor 813 and the other capacitance.

[FORMULA 2]

$$Q_A = C_A V_A + \text{const} \qquad (2)$$

Since current $I_A$ of the node A is the time derivative of charge flowing into the node A (or charge flowing from the node A), the current $I_A$ of the node A is expressed by the following equation (3).

[FORMULA 3]

$$I_A \equiv \frac{\Delta Q_A}{\Delta t} = \frac{C_A \cdot \Delta F(\text{Vout})}{\Delta t} \qquad (3)$$

Here, as an example, $\Delta t$ is about 54000 sec. As the above, the current $I_A$ of the node A, which is leakage current can be calculated with the capacitance $C_A$ connected to the node A and the output voltage Vout, and thus the leakage current of the circuit for evaluating characteristics can be accordingly obtained.

Next, the results of measuring the output voltage by the measurement method using the above circuit for evaluating characteristics are shown, and the value of the leakage current of the circuit for evaluating characteristics, which is calculated from the measurement results, is shown.

Figure 12:
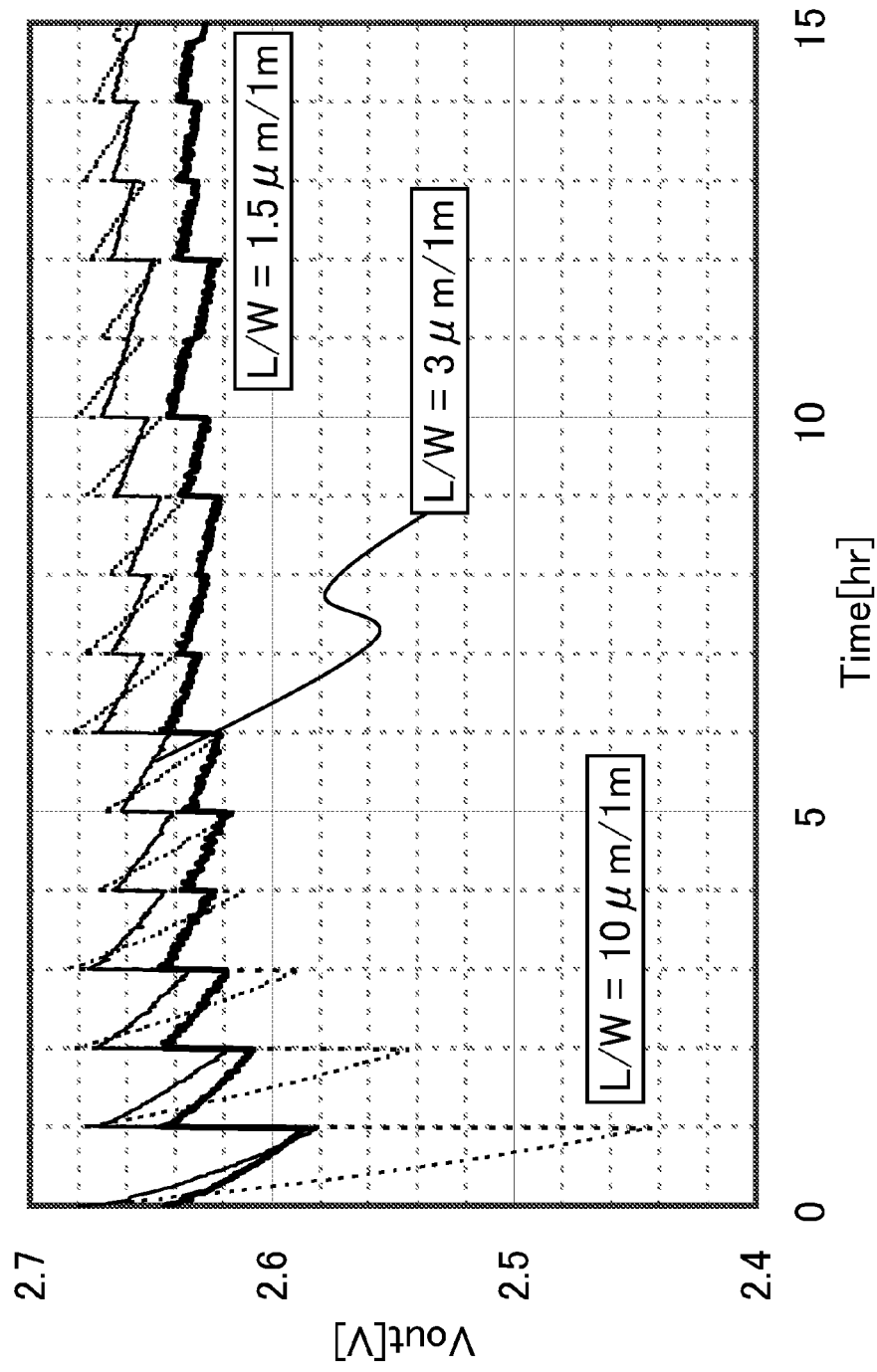
FIG. 12 is a graph showing a relation between the output voltage $V_{out}$ and elapsed time Time in measurement under a condition 4, a condition 5, and a condition 6.
Figure 13:
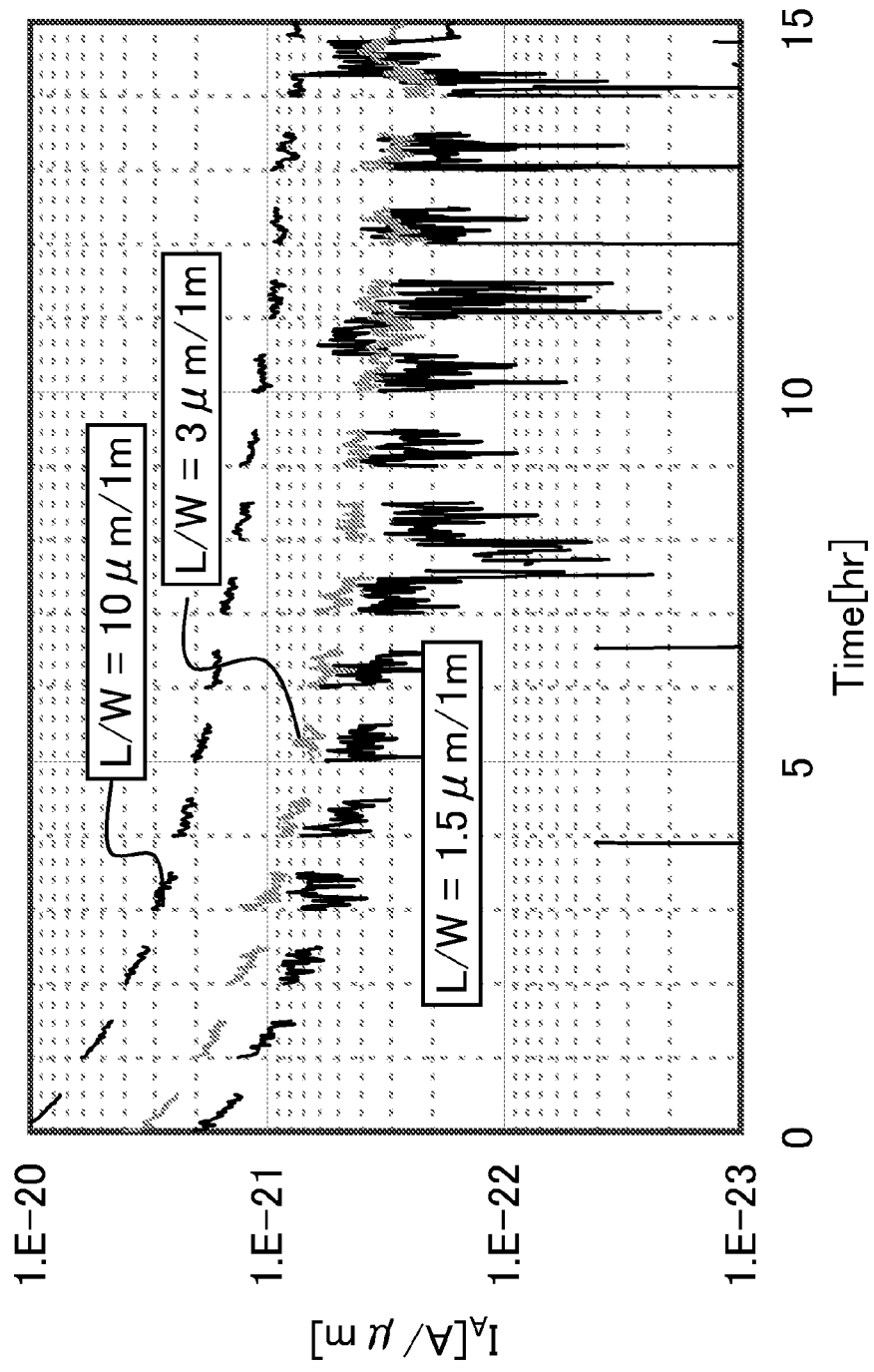
FIG. 13 is a graph showing a relation between leakage current calculated from measurement and elapsed time Time in the measurement.

FIG. 12 shows the relation between the output voltage Vout and the elapsed time Time in the measurement (the first accumulation and measurement operation) under a condition 4, a condition 5, and a condition 6. FIG. 13 shows the relation between the current $I_A$ calculated from the measurement and the elapsed time Time in the measurement. It is found that the output voltage Vout varies after the measurement starts and time required for obtaining the steady state is 10 hours or longer.

Figure 14:
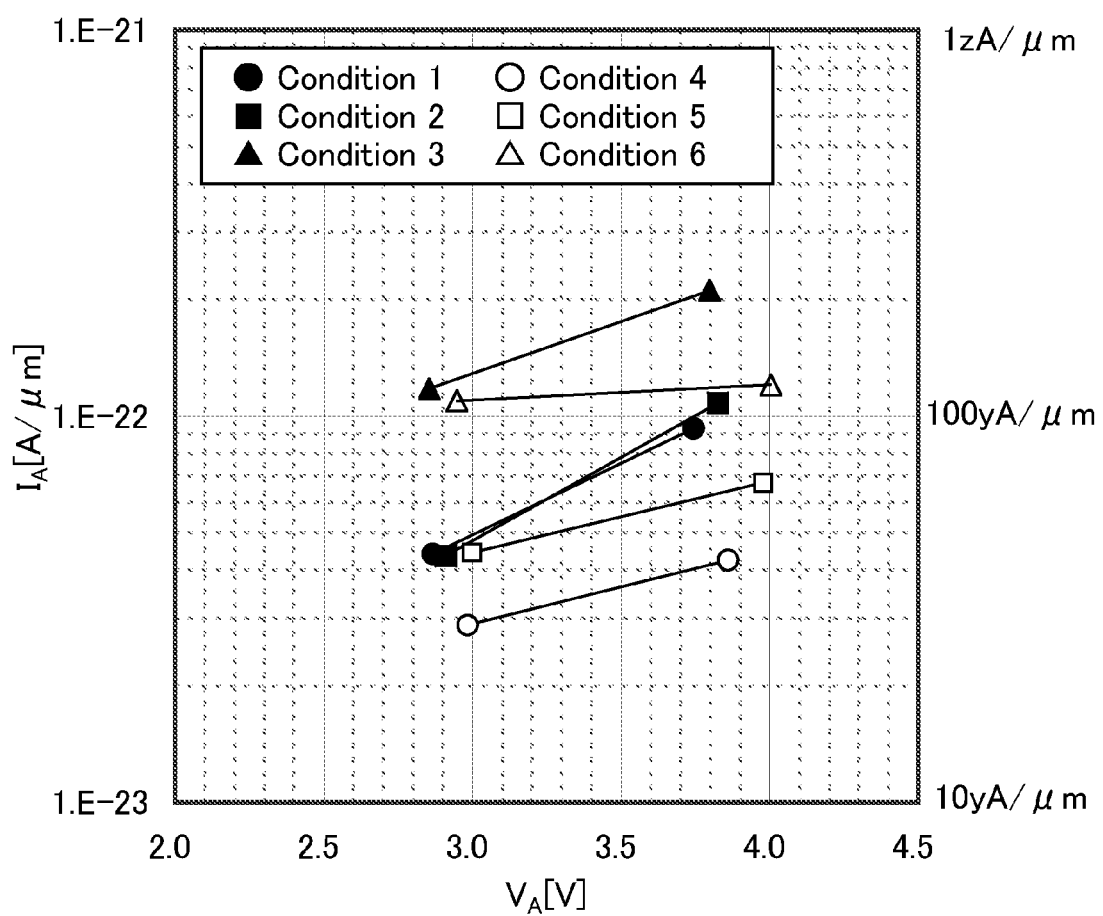
FIG. 14 is a graph showing a relation between leakage current and voltage of a node A estimated from measurement.

FIG. 14 shows the relation between the leakage current and the voltage of the node A under conditions 1 to 6 estimated from the measurement. According to FIG. 14, in a condition 4, for example, when the voltage of the node A is 3.0 V, the leakage current is 28 yA/μm. Since the leakage current includes the off-state current of the transistor 812, the off-state current of the transistor 812 can be considered to be 28 yA/μm or less.

Figure 15:
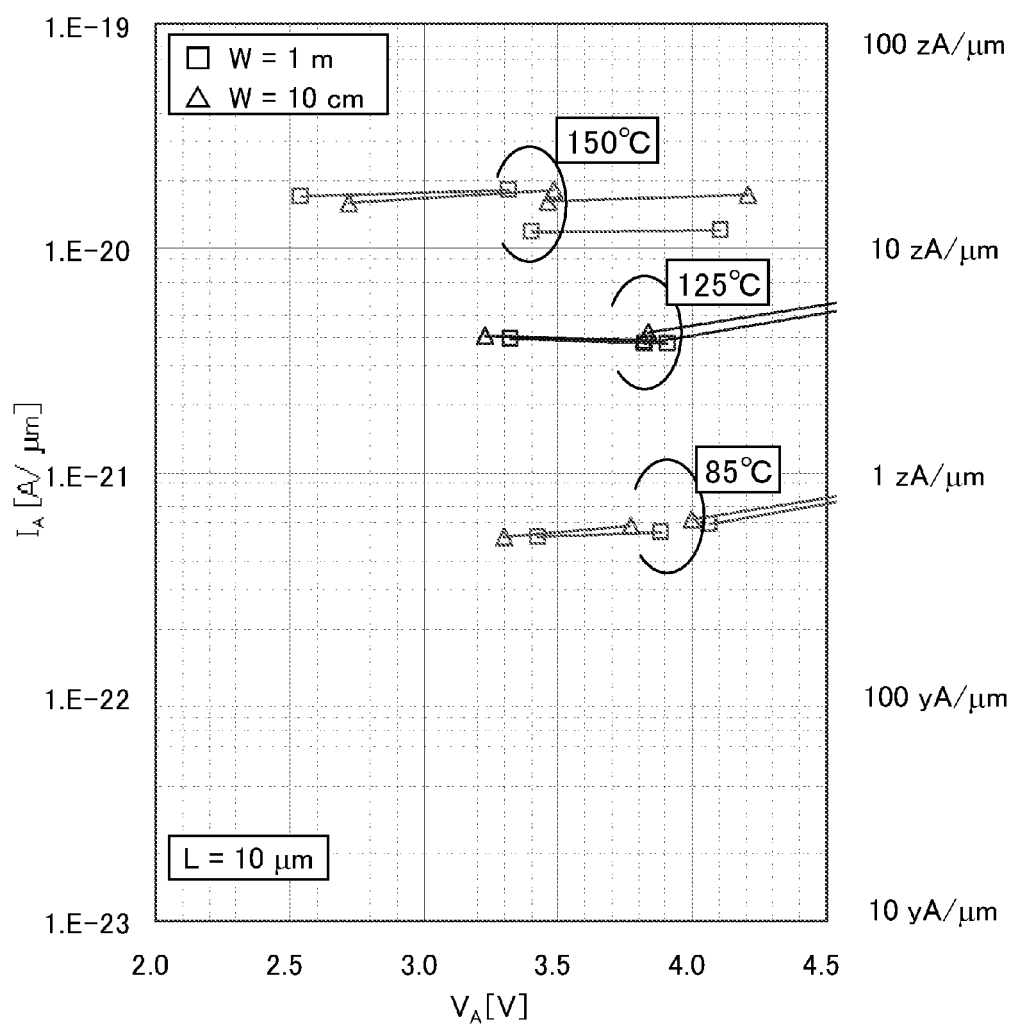
FIG. 15 is a graph showing a relation between leakage current and voltage of the node A estimated from measurement.
Figure 16:
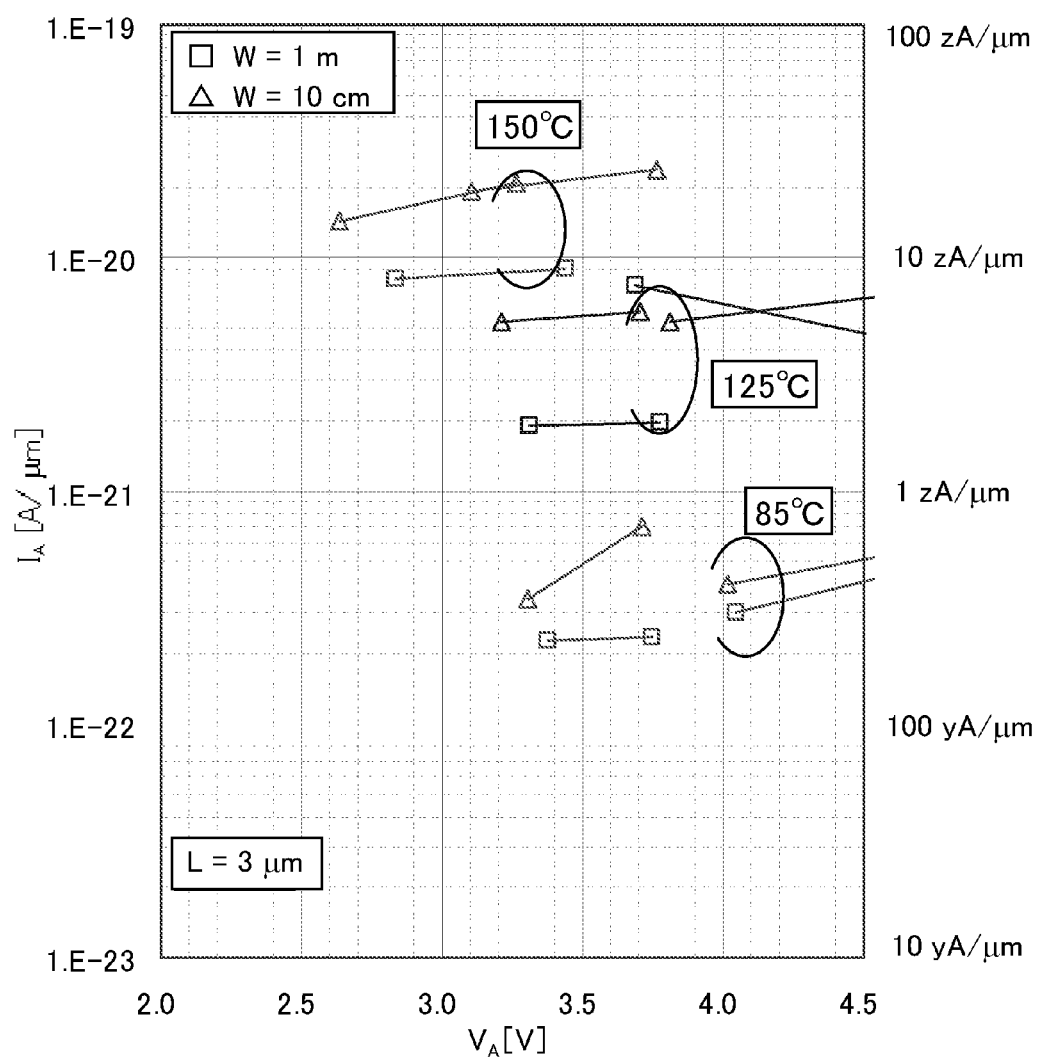
FIG. 16 is a graph showing a relation between leakage current and voltage of the node A estimated from measurement.
Figure 17:
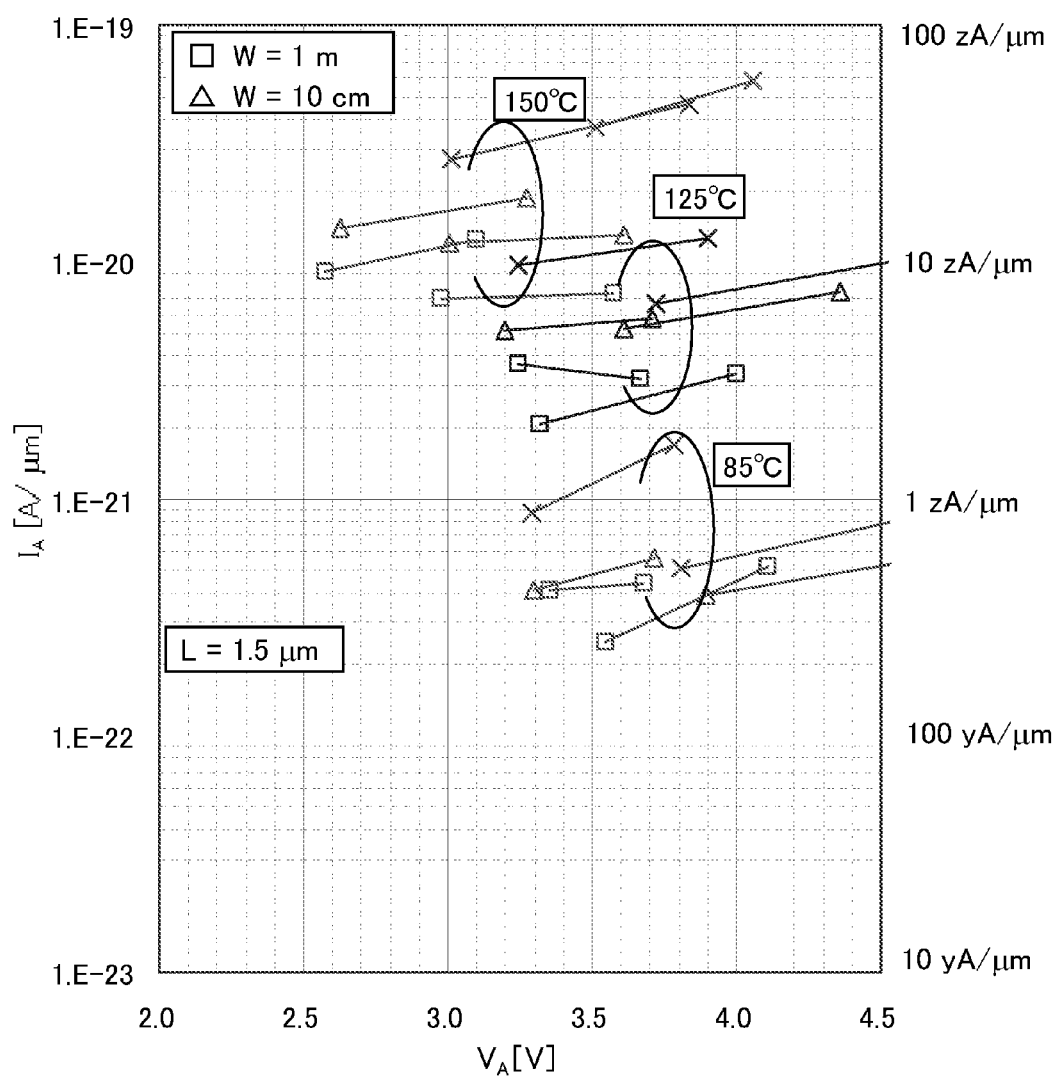
FIG. 17 is a graph showing a relation between leakage current and voltage of the node A estimated from measurement.

FIG. 15, FIG. 16, and FIG. 17 show the relation between the leakage current and the voltage of the node A under the conditions 1 to 6 estimated from the above measurement, at 85° C., 125° C., and 150° C. As shown in FIG. 15, FIG. 16, and FIG. 17, even in the case of 150° C., the leakage current is 100 zA/μm or less.

As described above, in the circuit for evaluating characteristics using a transistor which includes a highly purified oxide semiconductor layer having a function of a channel formation layer, the value of the leakage current is sufficiently low; thus, the off-state current of the transistor is significantly low. In addition, the off-state current of the above transistor is sufficiently low even when the temperature increases.

(Embodiment 6)

In this embodiment, an example of a structure of the photodetector including the display circuit in the above embodiment will be described.

The photodetector in this embodiment includes a first substrate provided with a semiconductor element such as a transistor (an active matrix substrate) and a second substrate.

Figure 18A:
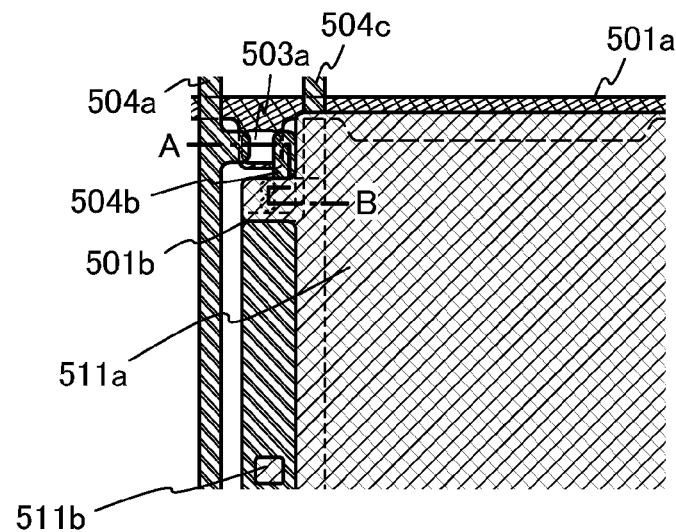
FIGS. 18A and 18B illustrate a structural example of an active matrix substrate in Embodiment 6.
Figure 18B:
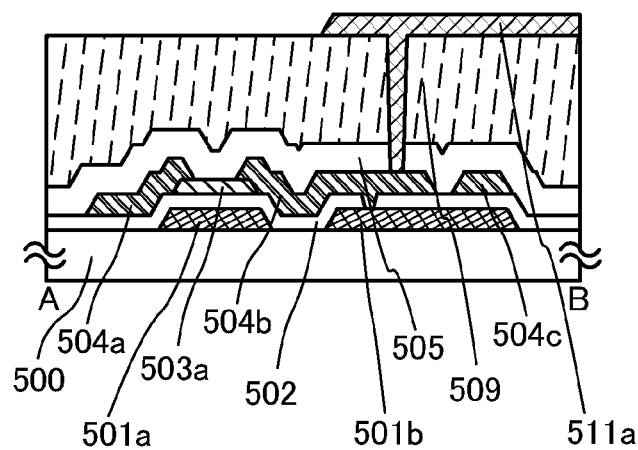
Figure 19A:
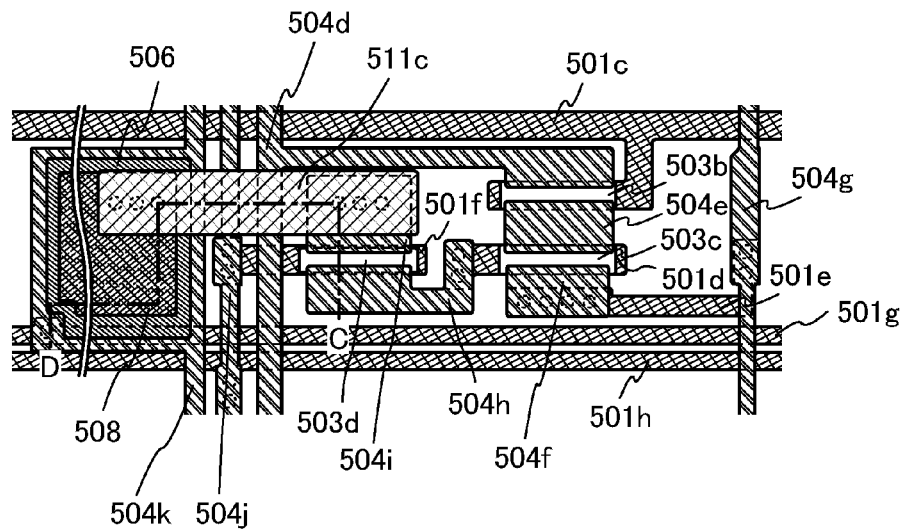
FIGS. 19A and 19B illustrate a structural example of an active matrix substrate in Embodiment 6.
Figure 19B:
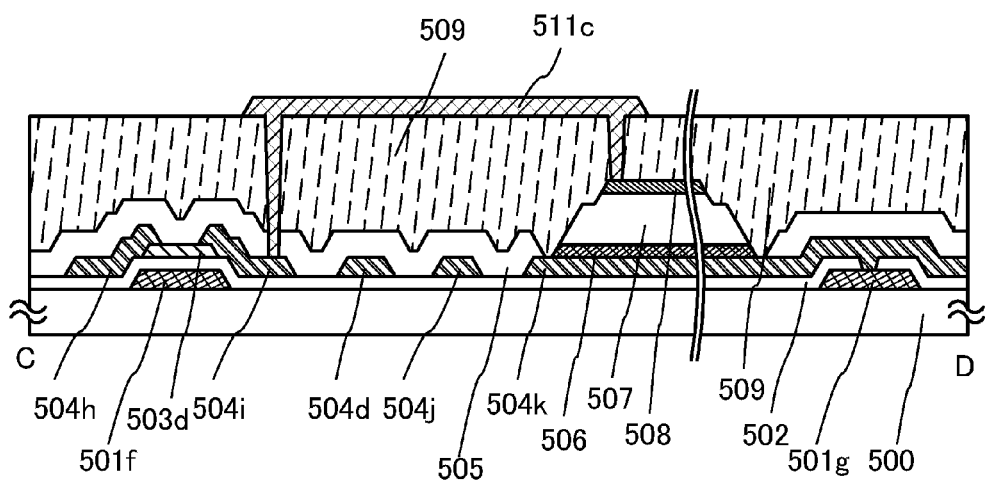

First, a structural example of the active matrix substrate in this embodiment is described with reference to FIGS. 18A and 18B and FIGS. 19A and 19B. FIGS. 18A and 18B and FIGS. 19A and 19B are views illustrating a structural example of the active matrix substrate in the photodetector of this embodiment. FIG. 18A is a plane schematic view and FIG. 18B is a cross-sectional schematic view along line A-B in FIG. 18A. FIG. 19A is a plan schematic view and FIG. 19B is a cross-sectional schematic view along line C-D in FIG. 19A. In FIGS. 19A and 19B, a photodetector circuit having a structure in which the transistor 134 of FIG. 6B is added to the structure of FIG. 6A is used as an example of the photodetector circuit. In FIGS. 18A and 18B and FIGS. 19A and 19B, as an example of a transistor including an oxide semiconductor layer, the transistor whose structure is described with reference to FIG. 8A in the above embodiment is used.

The active matrix substrate illustrated in FIGS. 18A and 18B and FIGS. 19A and 19B includes a substrate 500, conductive layers 501a to 501h, an insulating layer 502, semiconductor layers 503a to 503d, conductive layers 504a to 504k, an insulating layer 505, a semiconductor layer 506, a semiconductor layer 507, a semiconductor layer 508, an insulating layer 509, and conductive layers 511a to 511c.

Each of the conductive layers 501a to 501h is formed over one surface of the substrate 500.

The conductive layer 501a functions as a gate electrode of a display selection transistor in the display circuit.

The conductive layer 501b functions as a first electrode of a storage capacitor in the display circuit.

The conductive layer 501c functions as a gate electrode of a reading selection transistor in the photodetector circuit.

The conductive layer 501d functions as a gate electrode of an amplifying transistor in the photodetector circuit.

The conductive layer 501f functions as a gate electrode of an accumulation control transistor in the photodetector circuit.

The conductive layer 501g functions as a voltage supply line from which voltage Vb is inputted to one of a first terminal and a second terminal of a photoelectric conversion element in the photodetector circuit.

The conductive layer 501h functions as a signal line from which an accumulation control signal is inputted to the gate of the accumulation control transistor in the photodetector circuit.

The insulating layer 502 is provided over the one surface of the substrate 500 with the conductive layers 501a to 501h interposed therebetween.

The insulating layer 502 functions as a gate insulating layer of the display selection transistor in the display circuit, a dielectric layer of the storage capacitor in the display circuit, a gate insulating layer of the accumulation control transistor in the photodetector circuit, a gate insulating layer of the amplifying transistor in the photodetector circuit, and a gate insulating layer of the reading selection transistor in the photodetector circuit.

The semiconductor layer 503a overlaps with the conductive layer 501a with the insulating layer 502 interposed therebetween. The semiconductor layer 503a functions as a channel formation layer of the display selection transistor in the display circuit.

The semiconductor layer 503b overlaps with the conductive layer 501c with the insulating layer 502 interposed therebetween. The semiconductor layer 503b functions as a channel formation layer of the reading selection transistor in the photodetector circuit.

The semiconductor layer 503c overlaps with the conductive layer 501d with the insulating layer 502 interposed therebetween. The semiconductor layer 503c functions as a channel formation layer of the amplifying transistor in the photodetector circuit.

The semiconductor layer 503d overlaps with the conductive layer 501f with the insulating layer 502 interposed therebetween. The semiconductor layer 503d functions as a channel formation layer of the accumulation control transistor in the photodetector circuit.

The conductive layer 504a is electrically connected to the semiconductor layer 503a. The conductive layer 504a functions as one of a source electrode and a drain electrode of the display selection transistor in the display circuit.

The conductive layer 504b is electrically connected to the conductive layer 501b and the semiconductor layer 503a. The conductive layer 504b functions as the other of the source electrode and the drain electrode of the display selection transistor in the display circuit.

The conductive layer 504c overlaps with the conductive layer 501b with the insulating layer 502 interposed therebetween. The conductive layer 504c functions as a second electrode of the storage capacitor in the display circuit.

The conductive layer 504d is electrically connected to the semiconductor layer 503b. The conductive layer 504d functions as one of a source electrode and a drain electrode of the reading selection transistor in the photodetector circuit.

The conductive layer 504f is electrically connected to the conductive layer 501e and the semiconductor layer 503c. The conductive layer 504f functions as one of a source electrode and a drain electrode of the amplifying transistor in the photodetector circuit.

The conductive layer 504g is electrically connected to the conductor layer 501e. The conductive layer 504g functions as a voltage supply line from which voltage is inputted to the one of the source electrode and the drain electrode of the amplifying transistor in the photodetector circuit.

The conductive layer 504e is electrically connected to the semiconductor layer 503b. The conductive layer 504e functions as the other of the source electrode and the drain electrode of the amplifying transistor in the photodetector circuit and the other of the source electrode and the drain electrode of the reading selection transistor in the photodetector circuit.

The conductive layer 504i is electrically connected to the semiconductor layer 503d. The conductive layer 504i functions as one of a source electrode and a drain electrode of the accumulation control transistor in the photodetector circuit.

The conductive layer 504h is electrically connected to the conductive layer 501d and the semiconductor layer 503d. The conductive layer 504h functions as the other of the source electrode and the drain electrode of the accumulation control transistor in the photodetector circuit.

The conductive layer 504j is electrically connected to the conductive layer 501f. The conductive layer 504j functions as a signal line from which the accumulation control signal is inputted to the gate of the accumulation control transistor in the photodetector circuit.

The conductive layer 504k is electrically connected to the conductive layer 501g. The conductive layer 504k functions as the one of the first terminal and the second terminal of the photoelectric conversion element in the photodetector circuit.

The insulating layer 505 is in contact with the semiconductor layer 503a and the semiconductor layer 503d with the conductive layers 504a to 504k interposed therebetween.

The semiconductor layer 506 is electrically connected to the conductive layer 504k.

The semiconductor layer 507 is in contact with the semiconductor layer 506.

The semiconductor layer 508 is in contact with the semiconductor layer 507.

The insulating layer 509 overlaps with the insulating layer 505, the semiconductor layer 506, the semiconductor layer 507, and the semiconductor layer 508. The insulating layer 509 functions as a planarization insulating layer in the display circuit and the photodetector circuit. Note that the insulating layer 509 is not necessarily provided.

The conductive layer 511a is electrically connected to the conductive layer 504b. The conductive layer 511a functions as a pixel electrode of a display element in the display circuit.

The conductive layer 511b is electrically connected to the conductive layer 504c. The conductive layer 511b functions as a wiring from which voltage is supplied to the second electrode of the storage capacitor in the display circuit.

The conductive layer 511c is electrically connected to the conductive layer 504i and the semiconductor layer 508.

Figure 20A:
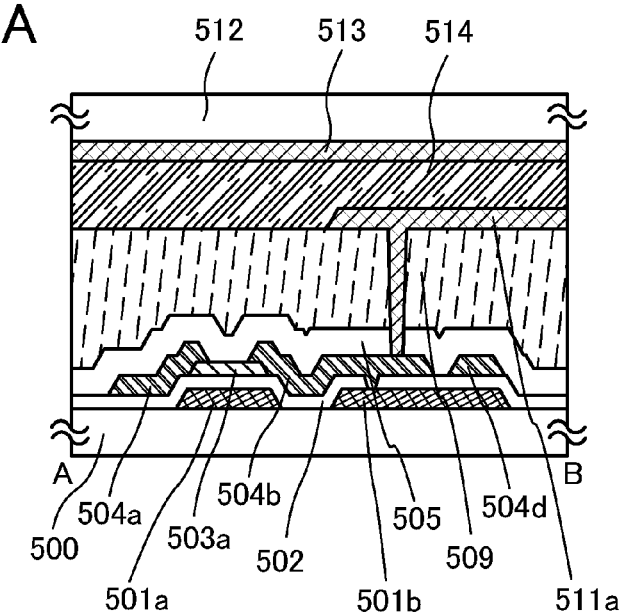
FIGS. 20A and 20B illustrate a structural example of a photodetector in Embodiment 6.
Figure 20B:
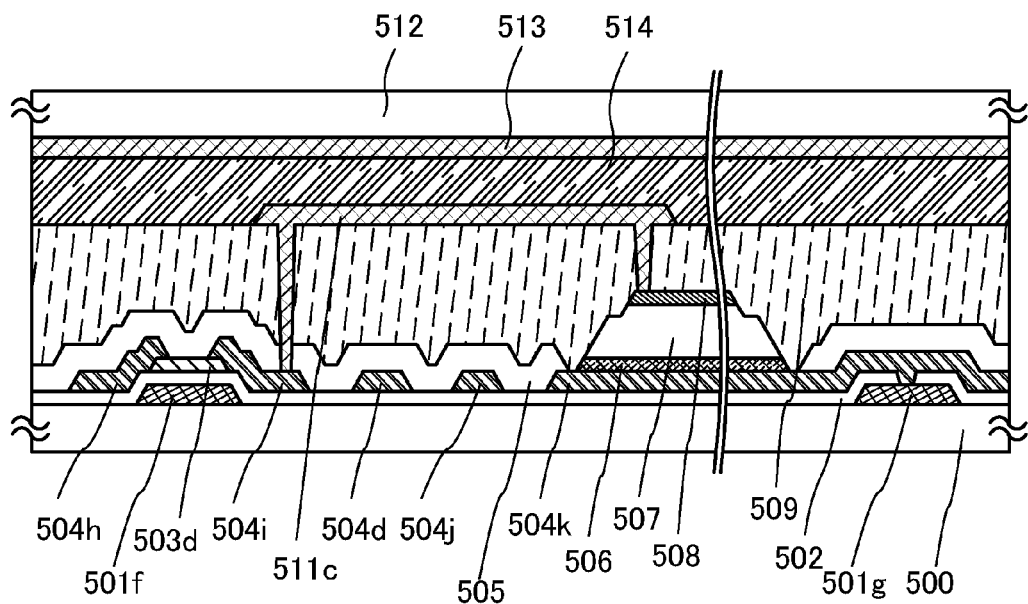

Further, another structural example of the photodetector of this embodiment is described with reference to FIGS. 20A and 20B. FIGS. 20A and 20B are cross-sectional schematic views illustrating a structural example of a display circuit in the photodetector of this embodiment. FIG. 20A is a cross-sectional schematic view of a display circuit, and FIG. 20B is a cross-sectional schematic view of a photodetector circuit. Note that a display element is a liquid crystal element as an example.

In the photodetector illustrated in FIGS. 20A and 20B, a substrate 512, a conductive layer 513, and a liquid crystal layer 514 are provided in addition to the active matrix substrate illustrated in FIGS. 18A and 18B and FIGS. 19A and 19B.

The conductive layer 513 is provided on one surface of the substrate 512. The conductive layer 513 functions as a common electrode of the display circuit.

The liquid crystal layer 514 is provided between the conductive layer 511a and the conductive layer 513 and overlaps with the semiconductor layer 508 with the insulating layer 509 interposed therebetween. The liquid crystal layer 514 functions as liquid crystal of the display element in the display circuit.

Note that in the display circuit, a color filter may be provided to overlap with the liquid crystal layer 514. With the color filter, full-color display can be performed even in the case where a light source of a light unit is a white emission diode.

As the substrate 500 and the substrate 512, a substrate which can be applied to the substrate 400a in FIG. 8A can be used.

As the conductive layers 501a to 501h, a layer whose material is applicable to the conductive layer 401a in FIG. 8A can be used. Alternatively, the conductive layers 501a to 501h may be formed by stacking layers whose materials are applicable to the conductive layer 401a.

As the insulating layer 502, a layer whose material is applicable to the insulating layer 402a in FIG. 8A can be used. Alternatively, the insulating layer 502 may be formed by stacking layers whose materials are applicable to the insulating layer 402a.

As the semiconductor layers 503a to 503d, a layer whose material is applicable to the oxide semiconductor layer 403a in FIG. 8A can be used. As the semiconductor layers 503a to 503d, a semiconductor layer using a semiconductor (e.g., silicon) belonging to Group 14 in the periodic table can be used as well.

As the conductive layers 504a to 504k, a layer whose material is applicable to the conductive layer 405a or the conductive layer 406a in FIG. 8A can be used. Alternatively, the conductive layers 504a to 504k may be formed by stacking layers whose materials are each applicable to the conductive layer 405a or the conductive layer 406a.

As the insulating layer 505, a layer whose material is applicable to the oxide insulating layer 407a in FIG. 8A can be used. Alternatively, the insulating layer 505 may be formed by stacking layers whose materials are applicable to the oxide insulating layer 407a.

The semiconductor layer 506 is a one-conductivity-type (either p-type or n-type) semiconductor layer. As the semiconductor layer 506, a semiconductor layer containing silicon can be used, for example.

The semiconductor layer 507 has lower resistance than the semiconductor layer 506. As the semiconductor layer 507, a semiconductor layer containing intrinsic silicon can be used, for example.

The semiconductor layer 508 is a semiconductor layer whose conductivity type is different from that of the semiconductor layer 506 (i.e., the other of p-type and n-type semiconductor layer). As the semiconductor layer 508, a semiconductor layer containing silicon can be used, for example.

As the insulating layer 509, a layer of an organic material such as polyimide, acrylic, or benzocyclobutene can be used. Alternatively, as the insulating layer 509, a layer of a low-dielectric constant material (also referred to as a low-k material) can be used.

As any of the conductive layers 511a to 511c and the conductive layer 513, a layer of a light-transmitting conductive material such as indium tin oxide, a metal oxide in which zinc oxide is mixed in indium oxide (also referred to as indium zinc oxide (IZO)), a conductive material in which silicon oxide ($SiO_2$) is mixed in indium oxide, organoindium, organotin, indium oxide containing tungsten oxide, indium zinc oxide containing tungsten oxide, indium oxide containing titanium oxide, indium tin oxide containing titanium oxide, or the like can be used.

A conductive composition containing a conductive high molecule (also referred to as a conductive polymer) can be used for the conductive layers 511a to 511c and the conductive layer 513. A conductive layer formed using the conductive composition preferably has a sheet resistance of 10000 ohms or less per square and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. As the π-electron conjugated conductive polymer, polyaniline or a derivative thereof, polypyrrole or a derivative thereof, polythiophene or a derivative thereof, or a copolymer of two or more of aniline, pyrrole, and thiophene or a derivative thereof can be given.

For the liquid crystal layer 514, for example, TN liquid crystal, OCB liquid crystal, STN liquid crystal, VA liquid crystal, ECB liquid crystal, GH liquid crystal, polymer dispersed liquid crystal, or discotic liquid crystal can be used.

As described with FIGS. 18A and 18B, FIGS. 19A and 19B, and FIGS. 20A and 20B, the photodetector of this embodiment includes the active matrix substrate provided with the transistor, the pixel electrode, and the photoelectric conversion element, the counter substrate, and the liquid crystal layer having liquid crystal between the active matrix substrate and the counter substrate. With the above structure, the photodetector circuit and the display circuit can be manufactured in one step; thus, manufacturing cost can be reduced.

(Embodiment 7)

In this embodiment, electronic devices each including the photodetector described in Embodiment 4 will be described.

Structural examples of electronic devices of this embodiment are described with reference to FIGS. 21A to 21F. FIGS. 21A to 21F each illustrates a structural example of the electronic device in this embodiment.

Figure 21A:
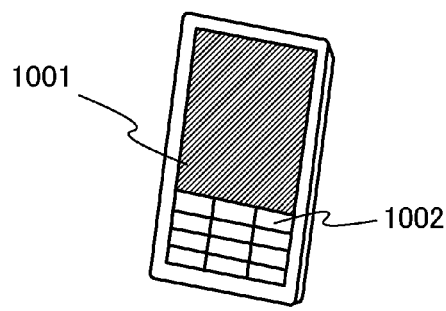
FIGS. 21A to 21F each illustrate an example of a structure of an electronic device in Embodiment 7.

The electronic device illustrated in FIG. 21A is a personal digital assistant. The personal digital assistant in FIG. 21A includes at least an input-output portion 1001. In the personal digital assistant in FIG. 21A, for example, the input-output portion 1001 can be provided with an operation portion 1002. For example, when the photodetector including the display circuit of the above embodiment is used for the input-output portion 1001, operation of the personal digital assistant or input of data to the personal digital assistant can be performed with a finger or a pen.

Figure 21D:
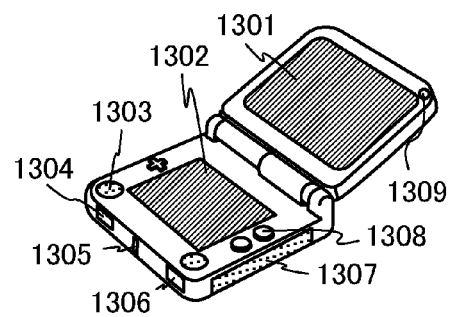
Figure 21B:
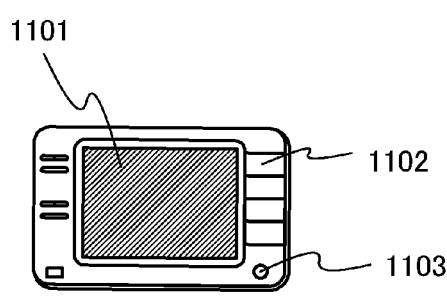

The electronic device illustrated in FIG. 21B is an information guide terminal including an automotive navigation system, for example. The information guide terminal in FIG. 21B includes an input-output portion 1101, operation buttons 1102, and an external input terminal 1103. For example, when the photodetector including the display circuit of the above embodiment is used for the input-output portion 1101, operation of the information guide terminal or input of data to the information guide terminal can be performed with a finger or a pen.

Figure 21E:
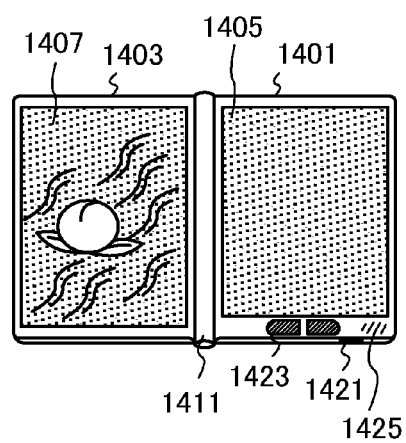
Figure 21C:
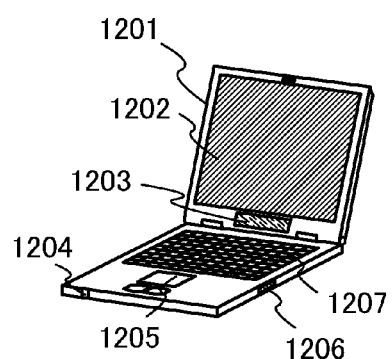

The electronic device illustrated in FIG. 21C is a laptop personal computer. The laptop personal computer illustrated in FIG. 21C includes a housing 1201, an input-output portion 1202, a speaker 1203, an LED lamp 1204, a pointing device 1205, a connection terminal 1206, and a keyboard 1207. For example, when the photodetector including the display circuit of the above embodiment is used for the input-output portion 1202, operation of the laptop personal computer or input of data to the laptop personal computer can be performed with a finger or a pen. Further, the photodetector of the above embodiment may be used for the pointing device 1205.

The electronic device illustrated in FIG. 21D is a portable game machine. The portable game machine in FIG. 21D includes an input-output portion 1301, an input-output portion 1302, a speaker 1303, a connection terminal 1304, an LED lamp 1305, a microphone 1306, a recording medium reading portion 1307, operation buttons 1308, and a sensor 1309. For example, when the photodetector including the display circuit of the above embodiment is used for either or both the input-output portion 1301 or/and the input-output portion 1302, operation of the portable game machine or input of data to the portable game machine can be performed with a finger or a pen.

The electronic device illustrated in FIG. 21E is an e-book reader. The e-book reader in FIG. 21E includes at least a housing 1401, a housing 1403, an input-output portion 1405, an input-output portion 1407, and a hinge 1411.

The housing 1401 and the housing 1403 are connected with the hinge 1411. The e-book reader illustrated in FIG. 21E can be opened and closed with the hinge 1411 as an axis. With such a structure, the e-book reader can be handled like a paper book. The input-output portion 1405 and the input-output portion 1407 are incorporated in the housing 1401 and the housing 1403, respectively. The input-output portion 1405 and the input-output portion 1407 may display different images. For example, one image can be displayed across both the input-output portions. In the case where different images are displayed on the input-output portion 1405 and the input-output portion 1407, for example, text may be displayed on the input-output portion on the right side (the input-output portion 1405 in FIG. 21E) and graphics may be displayed on the input-output portion on the left side (the input-output portion 1407 in FIG. 21E).

In the e-book reader in FIG. 21E, the housing 1401 or the housing 1403 may be provided with an operation portion or the like. For example, the e-book reader illustrated in FIG. 21E may include a power button 1421, an operation key 1423, and a speaker 1425. In the case of the e-book reader in FIG. 21E, pages of an image with a plurality of pages can be turned with the operation key 1423. Furthermore, in the e-book reader in FIG. 21E, a keyboard, a pointing device, or the like may be provided in either or both the input-output portion 1405 or/and the input-output portion 1407. Also in the e-book reader illustrated in FIG. 21E, an external connection terminal (an earphone terminal, a USB terminal, a terminal connectable to a variety of cables such as an AC adapter and a USB cable, or the like), a recording medium insertion portion, or the like may be provided on the back surface or side surface of the housing 1401 and the housing 1403. In addition, the e-book reader illustrated in FIG. 21E may have a function of an electronic dictionary.

For example, when the photodetector including the display circuit of the above embodiment is used for either or both the input-output portion 1405 or/and the input-output portion 1407, operation of the e-book reader or input of data to the e-book reader can be performed with a finger or a pen.

The e-book reader illustrated in FIG. 21E can have a configuration capable of transmitting and receiving data through wireless communication. With such a configuration, desired book data or the like can be purchased and downloaded from an electronic book server.

Figure 21F:
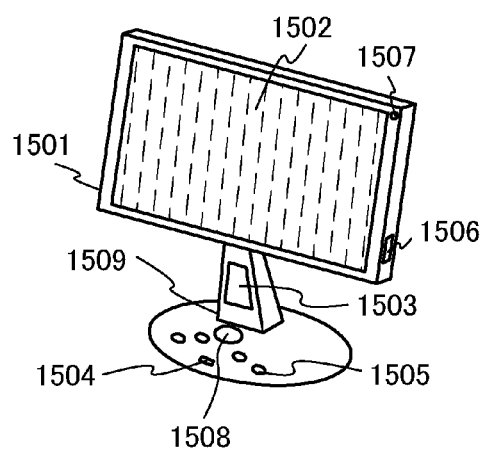

The electronic device illustrated in FIG. 21F is a display. The display in FIG. 21F includes a housing 1501, an input-output portion 1502, a speaker 1503, an LED lamp 1504, operation buttons 1505, a connection terminal 1506, a sensor 1507, a microphone 1508, and a supporting base 1509. For example, when the photodetector including the display circuit of the above embodiment is used for the input-output portion 1502, operation of the display or input of data to the display can be performed with a finger or a pen.

As described with FIGS. 21A to 21F, the electronic devices of this embodiment has an input-output portion in which the photodetector including the display circuit of the above embodiment is used. With such a structure, influence of external light can be suppressed, and detection accuracy of the input-output portion can be increased.

This application is based on Japanese Patent Application serial no. 2010-122208 filed with Japan Patent Office on May 28, 2010, the entire contents of which are hereby incorporated by reference.

What is claimed is:

1. A photodetector comprising:
a substrate;
a photodetector circuit on the substrate;
a display circuit on the substrate;
a light unit comprising a light source, a light guide plate, and a fixing member, and
a data processing circuit,
wherein the light guide plate comprises a first face, a second face opposite to the first face, and a third face, and is configured to be in contact with an object at a part of the first face and to reflect a light emitted from the light source at the part where the object contacts the first face,
wherein the second face of the light guide plate is configured to face the photodetector circuit,
wherein the fixing member is configured to fix the light source to the third face of the light guide plate and to overlap with the light source and a portion of the light guide plate, and
wherein the photodetector circuit is configured to generate a data signal from the light reflected at the part.

2. The photodetector according to claim 1,
wherein the photodetector circuit comprises:
a first transistor on the substrate;
a second transistor on the substrate; and
a photodiode,
wherein the display circuit comprises a third transistor on the substrate,
wherein a first terminal of the photodiode is connected to a first terminal of the first transistor,
wherein a second terminal of the first transistor is connected to a gate of the second transistor,
wherein the photodetector circuit performs a reset operation, performs an accumulation operation after the reset operation, performs a read operation after the accumulation operation, and generates the data signal,
wherein a potential of a second terminal of the photodiode is a first voltage in the reset operation and a second voltage in the accumulation operation and the read operation, and
wherein a potential of a gate of the first transistor is a third voltage in the reset operation and the accumulation operation and a fourth voltage in the read operation.

3. The photodetector according to claim 2,
wherein the first transistor comprises an oxide semiconductor layer in a channel.

4. A method for driving the photodetector according to claim 3, comprising the steps of:
performing a first reset operation of the photodetector circuit;
performing a first accumulation operation of the photodetector circuit after setting the light source to emit a first light;
performing a first read operation of the photodetector circuit;
generating a first data signal by the photodetector circuit;
performing a second reset operation of the photodetector circuit;
performing a second accumulation operation of the photodetector circuit after setting the light source to emit no light;
performing a second read operation of the photodetector circuit;
generating a second data signal by the photodetector circuit; and
generating a first difference data signal by the data processing circuit,
wherein the first difference data signal is a difference between the first data signal and the second data signal.

5. The method for driving the photodetector according to claim 4,
wherein the light source comprises a diode emitting the first light in an infrared region.

6. A photodetector comprising:
a substrate;
photodetector circuits arranged in a matrix on the substrate;
a display circuit on the substrate;
a light unit comprising a light source, a light guide plate, and a fixing member; and
a data processing circuit,
wherein the light guide plate comprises a first face, a second face opposite to the first face, and a third face, and is configured to be in contact with an object at a part of the first face and to reflect a light emitted from the light source at the part where the object contacts the first face,
wherein the second face of the light guide plate is configured to face the photodetector circuits, wherein the fixing member is configured to fix the light source to the third face of the light guide plate and to overlap with the light source and a portion of the light guide plate, and wherein each of the photodetector circuits is configured to generate a data signal from the light reflected at the part.

7. The photodetector according to claim 6, wherein each of the photodetector circuits comprises:

a first transistor on the substrate;

a second transistor on the substrate; and a photodiode, wherein the display circuit comprises a third transistor on the substrate, wherein a first terminal of each of the photodiodes is connected to a first terminal of each of the first transistors, wherein a second terminal of each of the first transistors is connected to a gate of each of the second transistors, wherein each of the photodetector circuits performs a reset operation simultaneously and performs an accumulation operation simultaneously after the reset operation, wherein each of the photodetector circuits performs a read operation sequentially after the accumulation operation and generates the data signal, wherein a potential of a second terminal of each of the photodiodes is a first voltage in the reset operation and a second voltage in the accumulation operation and the read operation, wherein a potential of a gate of each of the first transistors is a third voltage in the reset operation and the accumulation operation and a fourth voltage in the read operation.

8. The photodetector according to claim 7, wherein each of the first transistors comprises an oxide semiconductor layer in a channel.

9. A method for driving the photodetector according to claim 8, comprising the steps of:

performing a first reset operation of each of the photodetector circuits simultaneously;

performing a first accumulation operation of each of the photodetector circuits simultaneously after setting the light source to emit a first light;

performing a first read operation of each of the photodetector circuits sequentially;

generating a first data signal by each of the photodetector circuits;

performing a second reset operation of each of the photodetector circuits simultaneously;

performing a second accumulation operation of each of the photodetector circuits simultaneously after setting the light source to emit no light;

performing a second read operation of each of the photodetector circuits sequentially;

generating a second data signal by each of the photodetector circuits; and generating first difference data signals by the data processing circuit, wherein each of the first difference data signals is a difference between each of the first data signals and each of the second data signals.

10. The method for driving the photodetector according to claim 9, wherein the light source comprises a diode emitting the first light in an infrared region.

11. A method for driving the photodetector according to claim 8, comprising the steps of:

performing a first reset operation of each of the photodetector circuits simultaneously;

performing a first accumulation operation of each of the photodetector circuits simultaneously after setting the light source to emit a first light;

performing a first read operation of each of the photodetector circuits sequentially;

generating a first data signal by each of the photodetector circuits;

performing a second reset operation of each of the photodetector circuits simultaneously;

performing a second accumulation operation of each of the photodetector circuits simultaneously after setting the light source to emit a second light;

performing a second read operation of each of the photodetector circuits sequentially;

generating a second data signal by each of the photodetector circuits;

performing a third reset operation of each of the photodetector circuits simultaneously;

performing a third accumulation operation of each of the photodetector circuits simultaneously after setting the light source to emit a third light;

performing a third read operation of each of the photodetector circuits sequentially;

generating a third data signal by each of the photodetector circuits;

performing a fourth reset operation of each of the photodetector circuits simultaneously;

performing a fourth accumulation operation of each of the photodetector circuits simultaneously after setting the light source to emit no light;

performing a fourth read operation of each of the photodetector circuits sequentially;

generating a fourth data signal by each of the photodetector circuits;

generating first difference data signals by the data processing circuit;

generating second difference data signals by the data processing circuit; and generating third difference data signals by the data processing circuit;

wherein each of the first difference data signals is a difference between each of the first data signals and each of the fourth data signals, wherein each of the second difference data signals is a difference between each of the second data signals and each of the fourth data signals, and wherein each of the third difference data signals is a difference between each of the third data signals and each of the fourth data signals.

12. The method for driving the photodetector according to claim 11, wherein the light source comprises a red light-emitting diode emitting the first light, a green light-emitting diode emitting the second light, and a blue light-emitting diode emitting the third light.

13. A photodetector comprising:

a substrate;

display circuits arranged in a matrix on the substrate;

photodetector circuits arranged in a matrix on the substrate;

a light unit comprising a light source, a light guide plate, and a fixing member; and a data processing circuit, wherein each of the display circuits and each of the photodetector circuits are arranged periodically on a face of the substrate, wherein the light guide plate comprises a first face, a second face opposite to the first face, and a third face, and is configured to be in contact with an object at a part of the first face and to reflect a light emitted from the light source at the part where the object contacts the first face, wherein the second face of the light guide plate is configured to face the photodetector circuits, wherein the fixing member is configured to fix the light source to the third face of the light guide plate and to overlap with the light source and a portion of the light guide plate, and wherein each of the photodetector circuits generates a data signal from the light reflected at the part.

14. The photodetector according to claim 13,
wherein each of the photodetector circuits comprises:
a first transistor on the substrate;
a second transistor on the substrate; and
a photodiode,
wherein each of the display circuits comprises:
a third transistor on the substrate; and
a liquid crystal element,
wherein a first terminal of each of the photodiodes is connected to a first terminal of each of the first transistors,
wherein a second terminal of each of the first transistors is connected to a gate of each of the second transistors,
wherein each of the photodetector circuits performs a reset operation simultaneously and performs an accumulation operation simultaneously after the reset operation,
wherein each of the photodetector circuits performs a read operation sequentially after the accumulation operation and generates the data signal,
wherein a potential of a second terminal of each of the photodiodes is a first voltage in the reset operation and a second voltage in the accumulation operation and the read operation,
wherein a potential of a gate of each of the first transistors is a third voltage in the reset operation and the accumulation operation and a fourth voltage in the read operation,
wherein a first terminal of each of the third transistors is connected to a first terminal of each of the liquid crystal elements,
wherein each of the display circuits performs sequentially a display operation, and
wherein a potential of a gate of each of the third transistors is a fifth voltage in the display operation.

15. The photodetector according to claim 14,
wherein each of the first transistors comprises an oxide semiconductor layer in a channel, and
wherein each of the third transistors comprises an oxide semiconductor layer in a channel.

16. A method for driving the photodetector according to claim 15, comprising the steps of:
performing a first reset operation of each of the photodetector circuits simultaneously;
performing a first accumulation operation of each of the photodetector circuits simultaneously after setting the light source to emit a first light;
performing a first read operation of each of the photodetector circuits sequentially;
generating a first data signal by each of the photodetector circuits;
performing a second reset operation of each of the photodetector circuits simultaneously;
performing a second accumulation operation of each of the photodetector circuits simultaneously after setting the light source to emit no light;
performing a second read operation of each of the photodetector circuits sequentially;
generating a second data signal by each of the photodetector circuits;
generating first difference data signals by the data processing circuit; and
performing the display operation of each of the display circuits sequentially,
wherein each of the first difference data signals is a difference between each of the first data signals and each of the second data signals.

17. The method for driving the photodetector according to claim 16,
wherein the light source comprises a diode emitting the first light in an infrared region.

* * * * *